United States Patent
Haba et al.

(10) Patent No.: US 9,806,017 B2
(45) Date of Patent: *Oct. 31, 2017

(54) FLIP-CHIP, FACE-UP AND FACE-DOWN CENTERBOND MEMORY WIREBOND ASSEMBLIES

(71) Applicant: Tessera, Inc., San Jose, CA (US)

(72) Inventors: Belgacem Haba, Saratoga, CA (US); Richard Dewitt Crisp, Hornitos, CA (US); Wael Zohni, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/589,578

(22) Filed: Jan. 5, 2015

(65) Prior Publication Data

US 2015/0115477 A1    Apr. 30, 2015

Related U.S. Application Data

(62) Division of application No. 13/306,099, filed on Nov. 29, 2011, now Pat. No. 8,928,153.

(Continued)

(51) Int. Cl.
*H01L 23/48* (2006.01)
*H01L 23/52* (2006.01)
(Continued)

(52) U.S. Cl.
CPC .............. *H01L 23/50* (2013.01); *H01L 23/13* (2013.01); *H01L 23/3128* (2013.01);
(Continued)

(58) Field of Classification Search
CPC ....... H01L 2924/00; H01L 2224/48227; H01L 2224/4824; H01L 2224/4826;
(Continued)

(56) References Cited

U.S. PATENT DOCUMENTS 4,941,033 A    7/1990    Kishida
5,138,438 A    8/1992    Masayuki et al.
(Continued)

FOREIGN PATENT DOCUMENTS

CN    101034689 A    9/2007
CN    101055840 A    10/2007
(Continued)

OTHER PUBLICATIONS

Taiwanese Office Action for Application No. 104130271 dated Feb. 15, 2016.
(Continued)

*Primary Examiner* — Duy T Nguyen
(74) *Attorney, Agent, or Firm* — Lerner, David, Littenberg, Krumholz & Mentlik, LLP

(57) ABSTRACT

A microelectronic assembly can include a substrate having first and second surfaces and an aperture extending therebetween, the substrate having terminals. The assembly can also include a first microelectronic element having a front surface facing the first surface of the substrate, a second microelectronic element having a front surface facing the first microelectronic element and projecting beyond an edge of the first microelectronic element, first and second leads electrically connecting contacts of the respective first and second microelectronic elements to the terminals, and third leads electrically interconnecting the contacts of the first and second microelectronic elements. The contacts of the first microelectronic element can be exposed at the front surface thereof adjacent the edge thereof. The contacts of the second microelectronic element can be disposed in a central region of the front surface thereof. The first, second, and third leads can have portions aligned with the aperture.

20 Claims, 11 Drawing Sheets

Related U.S. Application Data

(60) Provisional application No. 61/477,967, filed on Apr. 21, 2011.

(51) Int. Cl.
| | | |
|---|---|---|
| *H01L 29/40* | (2006.01) | |
| *H01L 23/50* | (2006.01) | |
| *H01L 23/31* | (2006.01) | |
| *H01L 25/065* | (2006.01) | |
| *H01L 25/10* | (2006.01) | |
| *H01L 25/16* | (2006.01) | |
| *H01L 23/13* | (2006.01) | |
| *H01L 23/498* | (2006.01) | |
| H01L 23/00 | (2006.01) | |
| H01L 25/18 | (2006.01) | |

(52) U.S. Cl.
CPC ........ *H01L 23/49811* (2013.01); *H01L 24/49* (2013.01); *H01L 25/0652* (2013.01); *H01L 25/0657* (2013.01); *H01L 25/105* (2013.01); *H01L 25/16* (2013.01); *H01L 23/49816* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 25/18* (2013.01); *H01L 2224/0401* (2013.01); *H01L 2224/04042* (2013.01); *H01L 2224/05624* (2013.01); *H01L 2224/05644* (2013.01); *H01L 2224/05647* (2013.01); *H01L 2224/05655* (2013.01); *H01L 2224/06135* (2013.01); *H01L 2224/06136* (2013.01); *H01L 2224/131* (2013.01); *H01L 2224/16225* (2013.01); *H01L 2224/16227* (2013.01); *H01L 2224/16245* (2013.01); *H01L 2224/29101* (2013.01); *H01L 2224/29191* (2013.01); *H01L 2224/32145* (2013.01); *H01L 2224/32225* (2013.01); *H01L 2224/32227* (2013.01); *H01L 2224/32245* (2013.01); *H01L 2224/4824* (2013.01); *H01L 2224/4826* (2013.01); *H01L 2224/48095* (2013.01); *H01L 2224/48137* (2013.01); *H01L 2224/48145* (2013.01); *H01L 2224/48227* (2013.01); *H01L 2224/48247* (2013.01); *H01L 2224/48472* (2013.01); *H01L 2224/4911* (2013.01); *H01L 2224/49112* (2013.01); *H01L 2224/49175* (2013.01); *H01L 2224/73203* (2013.01); *H01L 2224/73204* (2013.01); *H01L 2224/73215* (2013.01); *H01L 2224/73253* (2013.01); *H01L 2224/73265* (2013.01); *H01L 2225/0651* (2013.01); *H01L 2225/06562* (2013.01); *H01L 2225/06575* (2013.01); *H01L 2225/06589* (2013.01); *H01L 2225/107* (2013.01); *H01L 2225/1023* (2013.01); *H01L 2225/1029* (2013.01); *H01L 2225/1047* (2013.01); *H01L 2225/1052* (2013.01); *H01L 2225/1058* (2013.01); *H01L 2924/0001* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01049* (2013.01); *H01L 2924/01076* (2013.01); *H01L 2924/01079* (2013.01); *H01L 2924/01082* (2013.01); *H01L 2924/01087* (2013.01); *H01L 2924/09701* (2013.01); *H01L 2924/10253* (2013.01); *H01L 2924/10329* (2013.01); *H01L 2924/12* (2013.01); *H01L 2924/1205* (2013.01); *H01L 2924/1206* (2013.01); *H01L 2924/1207* (2013.01); *H01L 2924/1431* (2013.01); *H01L 2924/1433* (2013.01); *H01L 2924/1435* (2013.01); *H01L 2924/1436* (2013.01); *H01L 2924/1437* (2013.01); *H01L 2924/1438* (2013.01); *H01L 2924/1443* (2013.01); *H01L 2924/14511* (2013.01); *H01L 2924/157* (2013.01); *H01L 2924/1517* (2013.01); *H01L 2924/1579* (2013.01); *H01L 2924/15151* (2013.01); *H01L 2924/15165* (2013.01); *H01L 2924/15172* (2013.01); *H01L 2924/15182* (2013.01); *H01L 2924/15311* (2013.01); *H01L 2924/15331* (2013.01); *H01L 2924/15787* (2013.01); *H01L 2924/15788* (2013.01); *H01L 2924/181* (2013.01); *H01L 2924/19107* (2013.01); *H01L 2924/3011* (2013.01)

(58) Field of Classification Search
CPC . H01L 2224/73215; H01L 2224/32145; H01L 2224/49175; H01L 2224/48247; H01L 2924/014; H01L 25/0657; H01L 2924/15331
USPC .......................................... 257/777
See application file for complete search history.

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,222,014 A | 6/1993 | Lin |
| 5,347,159 A | 9/1994 | Khandros et al. |
| 5,480,840 A | 1/1996 | Barnes et al. |
| 5,679,977 A | 10/1997 | Khandros et al. |
| 5,777,391 A | 7/1998 | Nakamura et al. |
| 5,804,874 A | 9/1998 | An et al. |
| 5,861,666 A | 1/1999 | Bellaar |
| 5,883,426 A | 3/1999 | Tokuno et al. |
| 5,977,640 A | 11/1999 | Bertin et al. |
| 5,998,864 A | 12/1999 | Khandros et al. |
| 6,021,048 A | 2/2000 | Smith |
| 6,072,233 A | 6/2000 | Corisis et al. |
| 6,093,029 A | 7/2000 | Kwon et al. |
| 6,150,724 A | 11/2000 | Wenzel et al. |
| 6,169,325 B1 | 1/2001 | Azuma et al. |
| 6,180,881 B1 | 1/2001 | Isaak |
| 6,199,743 B1 | 3/2001 | Bettinger et al. |
| 6,218,728 B1 | 4/2001 | Kimura |
| 6,218,731 B1 | 4/2001 | Huang et al. |
| 6,268,649 B1 | 7/2001 | Corisis et al. |
| 6,335,565 B1 | 1/2002 | Miyamoto et al. |
| 6,343,019 B1 | 1/2002 | Jiang et al. |
| 6,353,539 B1 | 3/2002 | Horine et al. |
| 6,369,448 B1 | 4/2002 | McCormick |
| 6,385,049 B1 | 5/2002 | Chia-Yu et al. |
| 6,392,292 B1 | 5/2002 | Morishita |
| 6,414,396 B1 | 7/2002 | Shim et al. |
| 6,426,560 B1 | 7/2002 | Kawamura et al. |
| 6,445,594 B1 * | 9/2002 | Nakagawa ............ H01L 23/13 257/723 |
| 6,472,741 B1 | 10/2002 | Chen et al. |
| 6,492,726 B1 | 12/2002 | Quek et al. |
| 6,583,502 B2 | 6/2003 | Lee et al. |
| 6,703,713 B1 | 3/2004 | Tseng et al. |
| 6,720,666 B2 | 4/2004 | Lim et al. |
| 6,731,009 B1 | 5/2004 | Jones et al. |
| 6,734,542 B2 | 5/2004 | Nakatani et al. |
| 6,742,098 B1 | 5/2004 | Halbert et al. |
| 6,762,942 B1 | 7/2004 | Smith |
| 6,793,116 B2 | 9/2004 | Harada |
| 6,811,580 B1 | 11/2004 | Littecke |
| 6,818,474 B2 | 11/2004 | Kim et al. |
| 6,841,870 B2 | 1/2005 | Misumi |

(56) References Cited

U.S. PATENT DOCUMENTS

| | | |
|---|---|---|
| 6,977,440 B2 | 12/2005 | Pflughaupt et al. |
| 7,061,105 B2 | 6/2006 | Masuda et al. |
| 7,061,121 B2 | 6/2006 | Haba |
| 7,095,104 B2 | 8/2006 | Blackshear |
| 7,205,656 B2 | 4/2007 | Kim et al. |
| 7,293,716 B1 | 11/2007 | Miks |
| 7,323,773 B2 | 1/2008 | Hayashi et al. |
| 7,389,937 B2 | 6/2008 | Ito |
| 7,440,289 B2 | 10/2008 | Sugano et al. |
| 7,462,936 B2 | 12/2008 | Haba et al. |
| 7,504,284 B2 | 3/2009 | Ye et al. |
| 7,633,146 B2 | 12/2009 | Masuda et al. |
| 7,638,868 B2 | 12/2009 | Haba |
| 7,855,462 B2 | 12/2010 | Boon et al. |
| 7,880,310 B2 | 2/2011 | Mathew |
| 7,892,889 B2 | 2/2011 | Howard et al. |
| 7,969,006 B2 | 6/2011 | Lin et al. |
| 8,026,589 B1 | 9/2011 | Kim et al. |
| 8,054,665 B2 | 11/2011 | Ahn et al. |
| 8,233,303 B2 | 7/2012 | Best et al. |
| 8,254,155 B1 | 8/2012 | Crisp et al. |
| 8,288,862 B2 | 10/2012 | Khiang et al. |
| 8,304,881 B1 | 11/2012 | Haba et al. |
| 8,338,963 B2 | 12/2012 | Haba et al. |
| 8,378,478 B2 | 2/2013 | Desai et al. |
| RE45,463 E | 4/2015 | Haba |
| 9,013,033 B2 | 4/2015 | Haba et al. |
| 2001/0005311 A1 | 6/2001 | Duesman et al. |
| 2002/0030267 A1 | 3/2002 | Suzuki |
| 2002/0053727 A1 | 5/2002 | Kimura |
| 2002/0175421 A1 | 11/2002 | Kimura |
| 2003/0064547 A1 | 4/2003 | Akram et al. |
| 2003/0116349 A1 | 6/2003 | Hashimoto |
| 2003/0179549 A1 | 9/2003 | Zhong et al. |
| 2003/0183917 A1 | 10/2003 | Tsai et al. |
| 2003/0193788 A1 | 10/2003 | Farnworth et al. |
| 2003/0224553 A1 | 12/2003 | Manansala |
| 2004/0016939 A1 | 1/2004 | Akiba et al. |
| 2004/0016999 A1 | 1/2004 | Misumi |
| 2004/0124520 A1 | 7/2004 | Rinne |
| 2004/0184240 A1 | 9/2004 | Su |
| 2004/0222534 A1 | 11/2004 | Sawamoto et al. |
| 2004/0262774 A1 | 12/2004 | Kang et al. |
| 2005/0110125 A1 | 5/2005 | Blackshear |
| 2005/0110162 A1 | 5/2005 | Meyer-Berg et al. |
| 2005/0116326 A1 | 6/2005 | Haba et al. |
| 2005/0116358 A1* | 6/2005 | Haba .................. H01L 25/0652 257/789 |
| 2005/0133932 A1 | 6/2005 | Pohl et al. |
| 2005/0164486 A1 | 7/2005 | Lua et al. |
| 2005/0173807 A1 | 8/2005 | Zhu et al. |
| 2005/0218514 A1 | 10/2005 | Massingill |
| 2005/0258538 A1 | 11/2005 | Gerber |
| 2006/0006405 A1 | 1/2006 | Mazzochette |
| 2006/0027902 A1 | 2/2006 | Ararao et al. |
| 2006/0049513 A1 | 3/2006 | Goodwin |
| 2006/0081583 A1 | 4/2006 | Hembree et al. |
| 2006/0097379 A1 | 5/2006 | Wang |
| 2006/0097400 A1 | 5/2006 | Cruz et al. |
| 2006/0113653 A1 | 6/2006 | Xiaoqi et al. |
| 2006/0145323 A1 | 7/2006 | Lee |
| 2006/0197210 A1 | 9/2006 | Kim |
| 2006/0231938 A1 | 10/2006 | Mangrum |
| 2006/0249827 A1 | 11/2006 | Fasano et al. |
| 2006/0290005 A1 | 12/2006 | Thomas et al. |
| 2007/0066139 A1 | 3/2007 | Roeper et al. |
| 2007/0075409 A1 | 4/2007 | Letterman et al. |
| 2007/0108592 A1 | 5/2007 | Lai et al. |
| 2007/0120238 A1 | 5/2007 | Vaiyapuri |
| 2007/0152310 A1* | 7/2007 | Osborn .................. H01L 24/24 257/678 |
| 2007/0160817 A1 | 7/2007 | Roh |
| 2007/0164407 A1 | 7/2007 | Jun et al. |
| 2007/0176297 A1 | 8/2007 | Zohni |
| 2007/0176298 A1 | 8/2007 | Osone et al. |
| 2007/0181989 A1 | 8/2007 | Corisis et al. |
| 2007/0218689 A1 | 9/2007 | Ha et al. |
| 2007/0235886 A1 | 10/2007 | Yilmaz et al. |
| 2007/0241441 A1 | 10/2007 | Choi et al. |
| 2007/0257376 A1 | 11/2007 | Shimokawa et al. |
| 2008/0001241 A1 | 1/2008 | Tuckerman et al. |
| 2008/0001309 A1 | 1/2008 | Tago |
| 2008/0023805 A1* | 1/2008 | Howard ............. H01L 23/3121 257/666 |
| 2008/0036067 A1 | 2/2008 | Lin |
| 2008/0042249 A1 | 2/2008 | Haba |
| 2008/0048777 A1 | 2/2008 | Kohjiro et al. |
| 2008/0067248 A1 | 3/2008 | Hiew et al. |
| 2008/0073777 A1 | 3/2008 | Cui et al. |
| 2008/0093725 A1 | 4/2008 | Jung et al. |
| 2008/0116557 A1 | 5/2008 | Paek et al. |
| 2008/0122067 A1 | 5/2008 | Wang |
| 2008/0136006 A1 | 6/2008 | Jang et al. |
| 2008/0237844 A1 | 10/2008 | Aleksov et al. |
| 2008/0237887 A1 | 10/2008 | Takiar et al. |
| 2008/0237891 A1 | 10/2008 | Irsigler et al. |
| 2008/0246130 A1 | 10/2008 | Carney et al. |
| 2008/0296717 A1 | 12/2008 | Beroz et al. |
| 2008/0303153 A1 | 12/2008 | Oi et al. |
| 2008/0315377 A1 | 12/2008 | Eichelberger et al. |
| 2009/0001542 A1 | 1/2009 | Kim |
| 2009/0017583 A1 | 1/2009 | Jun et al. |
| 2009/0045524 A1 | 2/2009 | Mohammed et al. |
| 2009/0051043 A1 | 2/2009 | Wong et al. |
| 2009/0057864 A1 | 3/2009 | Choi et al. |
| 2009/0068858 A1 | 3/2009 | Di Stefano |
| 2009/0079061 A1 | 3/2009 | Mallik et al. |
| 2009/0104734 A1 | 4/2009 | Specht et al. |
| 2009/0108422 A1 | 4/2009 | Sasaki et al. |
| 2009/0166839 A1 | 7/2009 | Suzuki et al. |
| 2009/0168363 A1 | 7/2009 | Clayton et al. |
| 2009/0168366 A1 | 7/2009 | Clayton et al. |
| 2009/0179321 A1 | 7/2009 | Sakamoto et al. |
| 2009/0185317 A1 | 7/2009 | Dijkhuis et al. |
| 2009/0200652 A1 | 8/2009 | Oh et al. |
| 2009/0200680 A1 | 8/2009 | Shinohara et al. |
| 2009/0236700 A1 | 9/2009 | Moriya |
| 2009/0243064 A1 | 10/2009 | Camacho et al. |
| 2009/0256266 A1 | 10/2009 | Lao et al. |
| 2009/0267222 A1 | 10/2009 | Zhong et al. |
| 2010/0019377 A1 | 1/2010 | Arvelo et al. |
| 2010/0044861 A1 | 2/2010 | Chiu et al. |
| 2010/0065955 A1 | 3/2010 | Chye et al. |
| 2010/0072602 A1 | 3/2010 | Sutardja |
| 2010/0090326 A1 | 4/2010 | Baek et al. |
| 2010/0127044 A1 | 5/2010 | Ota et al. |
| 2010/0127362 A1 | 5/2010 | Fan et al. |
| 2010/0133665 A1 | 6/2010 | Ha et al. |
| 2010/0193930 A1 | 8/2010 | Lee |
| 2010/0230795 A1 | 9/2010 | Kriman et al. |
| 2010/0244278 A1 | 9/2010 | Shen |
| 2010/0258928 A1 | 10/2010 | Chi et al. |
| 2010/0295166 A1* | 11/2010 | Kim ...................... H01L 21/56 257/692 |
| 2010/0314740 A1 | 12/2010 | Choi et al. |
| 2010/0321885 A1 | 12/2010 | Huang |
| 2010/0327419 A1 | 12/2010 | Muthukumar et al. |
| 2011/0079905 A1 | 4/2011 | Sanchez et al. |
| 2011/0085304 A1 | 4/2011 | Bindrup et al. |
| 2011/0193582 A1 | 8/2011 | Cho |
| 2011/0309152 A1 | 12/2011 | Kim |
| 2012/0091574 A1 | 4/2012 | Lin et al. |
| 2012/0092832 A1 | 4/2012 | Haba et al. |
| 2012/0126389 A1 | 5/2012 | Desai et al. |
| 2012/0153435 A1 | 6/2012 | Haba et al. |
| 2012/0155049 A1 | 6/2012 | Haba et al. |
| 2012/0267796 A1 | 10/2012 | Haba et al. |
| 2012/0267798 A1 | 10/2012 | Haba et al. |
| 2013/0015586 A1 | 1/2013 | Crisp et al. |
| 2013/0082394 A1 | 4/2013 | Crisp et al. |
| 2013/0099387 A1 | 4/2013 | Caskey et al. |
| 2013/0168843 A1 | 7/2013 | Zohni |

(56) References Cited

U.S. PATENT DOCUMENTS

| | | |
|---|---|---|
| 2013/0183862 A1 | 7/2013 | Ni et al. |
| 2013/0249116 A1 | 9/2013 | Mohammed et al. |
| 2014/0035121 A1 | 2/2014 | Haba et al. |

FOREIGN PATENT DOCUMENTS

| | | | |
|---|---|---|---|
| CN | 101232004 A | | 7/2008 |
| CN | 101494214 A | | 7/2009 |
| JP | 62107391 | | 5/1987 |
| JP | H08-227908 A | | 9/1996 |
| JP | H11-145323 A | | 5/1999 |
| JP | H11345932 A | | 12/1999 |
| JP | 2000243875 A | | 9/2000 |
| JP | 2001085609 A | | 3/2001 |
| JP | 2001118876 A | | 4/2001 |
| JP | 2001196407 A | | 7/2001 |
| JP | 2001223324 A | | 8/2001 |
| JP | 2002-076252 A | | 3/2002 |
| JP | 2003-101207 | | 4/2003 |
| JP | 2004-063767 A | | 2/2004 |
| JP | 2004063767 A | | 2/2004 |
| JP | 2005045251 A | | 2/2005 |
| JP | 2005166892 A | | 6/2005 |
| JP | 2005243975 A | | 9/2005 |
| JP | 2005251957 A | | 9/2005 |
| JP | 2006079629 A | | 3/2006 |
| JP | 2006093189 A | | 4/2006 |
| JP | 2006514438 A | | 4/2006 |
| JP | 2006-210892 | | 8/2006 |
| JP | 2006303079 A | | 11/2006 |
| JP | 2007123595 A | | 5/2007 |
| JP | 2007134426 A | | 5/2007 |
| JP | 2008135597 A | | 6/2008 |
| JP | 2008177241 A | | 7/2008 |
| JP | 2008-198841 A | | 8/2008 |
| JP | 2008187146 A | | 8/2008 |
| JP | 2008-235576 | | 10/2008 |
| JP | 2010501118 A | | 1/2010 |
| JP | 2010-098098 A | | 4/2010 |
| JP | 2010514080 A | | 4/2010 |
| JP | 2010206083 A | | 9/2010 |
| JP | 2010232653 A | | 10/2010 |
| JP | 2013546197 A | | 12/2013 |
| KR | 2001-0002214 A | | 1/2001 |
| KR | 20010081922 A | | 8/2001 |
| KR | 2001-0094894 A | | 11/2001 |
| KR | 10-0382035 B1 | | 5/2003 |
| KR | 10-0393095 B1 | | 7/2003 |
| KR | 2005-0119414 A | | 12/2005 |
| KR | 2006-0120365 A | | 11/2006 |
| KR | 10-0690247 B1 | | 2/2007 |
| KR | 1020060004298 | * | 3/2007 |
| KR | 2007-0088177 A | | 8/2007 |
| KR | 2009-0008341 A | | 1/2009 |
| KR | 2009-0086314 A | | 8/2009 |
| KR | 2010-0041430 A | | 4/2010 |
| KR | 101011863 B1 | | 1/2011 |
| KR | 101061531 B1 | | 9/2011 |
| TW | I301314 B | | 9/2008 |
| TW | I313049 B | | 8/2009 |
| TW | 201239998 | | 10/2012 |
| WO | 9812568 | | 3/1998 |
| WO | 2004080134 A2 | | 9/2004 |
| WO | 2007088757 A1 | | 8/2007 |
| WO | 2011001789 A1 | | 1/2011 |

OTHER PUBLICATIONS

Non-Final Rejection dated Nov. 19, 2012 in U.S. Appl. No. 12/907,522.
Amendment Filed Mar. 19, 2013 in Response to Non-Final Rejection dated Nov. 19, 2012 in U.S. Appl. No. 12/907,522.
Final Rejection dated May 8, 2013 in U.S. Appl. No. 12/907,522.
Amendment Filed May 24, 2013 in Response to Final Rejection dated May 8, 2013 in U.S. Appl. No. 12/907,522.
Non-Final Rejection dated Jan. 9, 2014 in U.S. Appl. No. 14/406,233.
Amendment Filed Apr. 9, 2014 in Response to Non-Final Rejection dated Jan. 9, 2014 in U.S. Appl. No. 14/046,233.
Final Rejection dated Jun. 20, 2014 in U.S. Appl. No. 14/046,233.
Amendment Filed Aug. 9, 2014 in Response to Final Rejection dated Jun. 20, 2014 in U.S. Appl. No. 14/046,233.
Japanese Office Action for Application No. 2014-506417 dated Apr. 14, 2015.
Taiwanese Office Action for Application No. 102138051 dated Apr. 7, 2015.
Japanese Office Action for Application No. 2104-506416 dated Jun. 19, 2015.
Japanese Office Action for Application No. 2014-506417 dated Aug. 4, 2015.
Asinash Roy et al: "Effects of Coupling Capacitance and Inductance on Delay Uncertainty and Clock Skew" , 2007 44th ACM/IEEE Design Automation Conference , San Diego, CA, Jun. 4-8, 2007, IEEE, PI Scataway, NJ , Jun. 1, 2007 (Jun. 1, 2007), pp. 184-187, XP031183328.
European Examination Report for Application No. 11776969.5 dated Jun. 27, 2014.
International Preliminary Report on Patentability for Application No. PCT/US2011/056352 dated Apr. 23, 2013.
International Search Report and Written Opinion for application No. PCT/US2012/029873 dated Jun. 4, 2012.
International Search Report and Written Opinion for Application No. PCT/US2012/029876 dated Aug. 17, 2012.
International Search Report and Written Opinion for Application No. PCT/US2012/032997 dated Aug. 7, 2012.
International Search Report and Written Opinion for Application No. PCT/US2012/071630 dated Apr. 4, 2013.
International Search Report and Written Opinion for Application No. PCT/US2013/053240 dated Sep. 16, 2013.
International Search Report and Written Opinion for Application No. PCT/US2013/065605 dated Feb. 21, 2014.
International Search Report and Written Opinion for PCT/US2012/034196 dated Jun. 4, 2012.
International Search Report Application No. PCT/US2011/031391, dated Dec. 12, 2011.
International Search Report for Application No. PCT/US2011/056352 dated Apr. 5, 2012.
Korean Application No. 10-2011-0041843, dated May, 3, 2011 (English translation of Spec and drawings).
Korean Search Report from U.S. Appl. No. 61/477,820, dated Sep. 6, 2011.
Korean Search Report from U.S. Appl. No. 61/477,877, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Office Action from Korean Patent Application No. 10-2010-0129888 dated Jan. 18, 2011.
Office Action from Korean Patent Application No. 10-2010-0129890 dated Jan. 18, 2011.
Partial International Search Report Application No. PCT/US2011/031391, dated Aug. 25, 2011.
Partial International Search Report for Application No. PCT/US2012/032997 dated Jun. 27, 2012.
Partial Search Report for Application No. PCT/US2013/065605 dated Nov. 28, 2013.
Search Report from Korean Patent Application No. 10-2010-0129888 dated Jan. 18, 2011.
Search Report from Korean Patent Application No. 10-2010-0129890 dated Jan. 18, 2011.
Second Written Opinion for Application No. PCT/US2013/053240 dated Jul. 29, 2014.
Taiwanese Office Action for Application No. 101112514 dated Mar. 13, 2014.
U.S. Appl. No. 61/477,877, filed Apr. 21, 2011.

(56) References Cited

OTHER PUBLICATIONS

Written Opinion of the International Preliminary Examining Authority dated Apr. 16, 2013 for Application No. PCT/US2012/029876.

Taiwanese Office Action for Application No. 101112511 dated Sep. 30, 2014.

\* cited by examiner

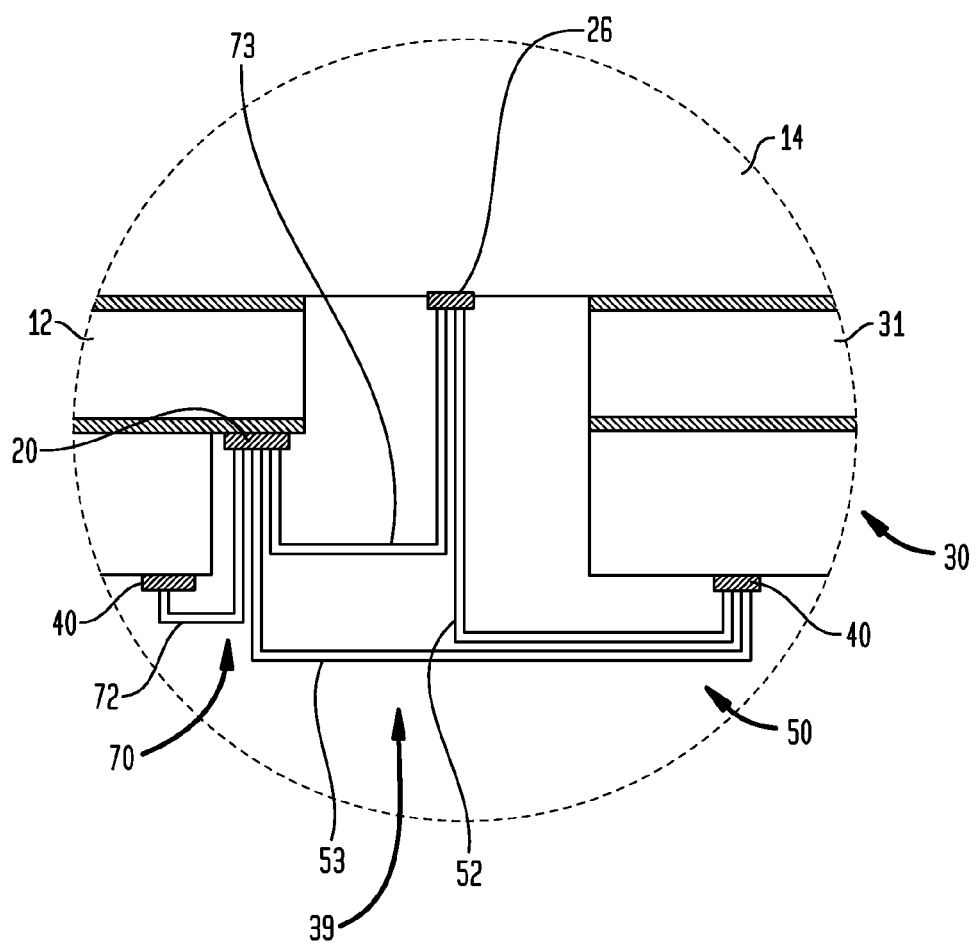

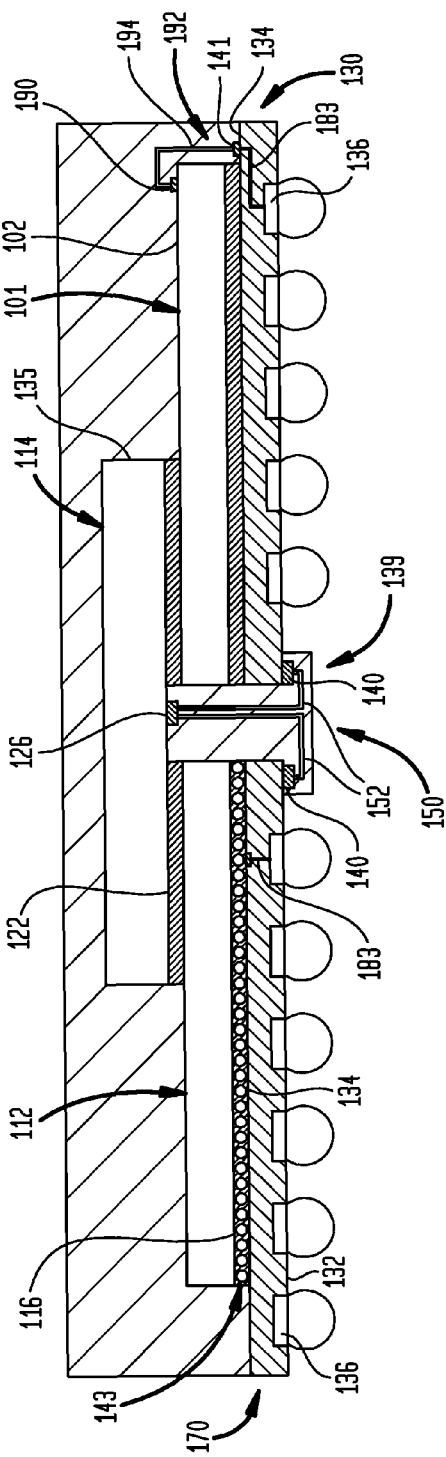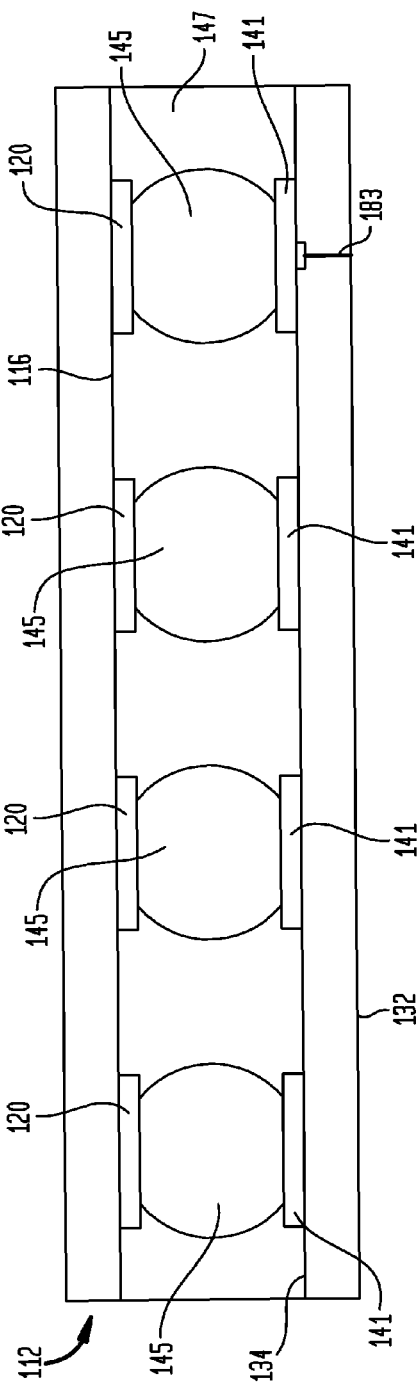

FLIP-CHIP, FACE-UP AND FACE-DOWN CENTERBOND MEMORY WIREBOND ASSEMBLIES

CROSS-REFERENCE TO RELATED APPLICATIONS

The present application is a divisional of U.S. patent application Ser. No. 13/306,099, filed Nov. 29, 2011, now U.S. Pat. No. 8,928,153, which claims the benefit of the filing date of U.S. Provisional Patent Application Ser. No. 61/477,967, filed Apr. 21, 2011, the disclosure of which is hereby incorporated by reference herein. The following commonly-owned applications are hereby incorporated by reference herein: U.S. Provisional Patent Application Ser. Nos. 61/477,820, 61/477,877, and 61/477,883, all filed Apr. 21, 2011.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the entire disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low, overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and 5,347,159, the entire disclosures of which are incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

BRIEF SUMMARY OF THE INVENTION

The present disclosure relates to microelectronic assemblies and method of manufacturing the same. In accordance with an aspect of the invention, a microelectronic assembly can include a substrate having oppositely-facing first and second surfaces and an aperture extending between the first and second surfaces, a first microelectronic element having a front surface facing the first surface of the substrate, and a second microelectronic element having a front surface facing the first microelectronic element. The substrate can have terminals. The first microelectronic element can also include a rear surface remote from the front surface and an edge extending between the front and rear surfaces. The first microelectronic element can have a plurality of contacts exposed at the front surface thereof adjacent the edge of the first microelectronic element. The second microelectronic element can have first and second opposed edges. The front surface of the second microelectronic element can extend between the first and second edges. The second microelectronic element can have a plurality of contacts disposed in a central region of the front surface thereof remote from the first and second edges. The front surface of the second microelectronic element can project beyond the edge of the first microelectronic element. The microelectronic assembly can also include first leads electrically connecting the contacts of the first microelectronic element to the terminals, second leads connecting the contacts of the second microelectronic element to the terminals, and third leads electrically interconnecting the contacts of the first microelectronic element with the contacts of the second microelectronic element. The first, second, and third leads can have portions aligned with the aperture.

In an exemplary embodiment, at least one of the first or second leads can include wire bonds extending from the contacts of at least one of the first or second microelectronic elements. In one embodiment, the portions of at least one of the first leads and the second leads aligned with the aperture can be portions of monolithic conductive elements having second portions extending along the substrate to the terminals. In a particular embodiment, the microelectronic assembly can also include a spacing element between the front surface of the second microelectronic element and the first surface of the substrate. In a particular embodiment, the first microelectronic element can include a chip configured to predominantly perform a logic function. In an exemplary embodiment, the second microelectronic element can have a greater number of active devices configured to provide memory storage array function than any other function. In one embodiment, the first microelectronic element can have a greater number of active devices configured to provide memory storage array function than any other function.

Further aspects of the invention can provide systems that incorporate microelectronic assemblies according to the foregoing aspects of the invention in conjunction with other electronic components electrically connected thereto. For example, the terminals can be electrically connected to a circuit panel. In another example, the system can be disposed in and/or mounted to a single housing, which can be a portable housing. Systems according to preferred embodiments in this aspect of the invention can be more compact than comparable conventional systems.

In one embodiment, a microelectronic component can include first and second microelectronic assemblies as described above. The first microelectronic assembly can be electrically connected with and can at least partially overlie the second microelectronic assembly. In an exemplary embodiment, the microelectronic assemblies can be electrically connected with one another through joining units arranged adjacent a periphery of the microelectronic component. In a particular embodiment, the joining units can be located outside of a depopulated central region of the microelectronic component. In one embodiment, some of the microelectronic elements can include a volatile random access memory (RAM), and some of the microelectronic elements can include nonvolatile flash memory. In a particular embodiment, at least one of the first microelectronic elements can be configured predominantly to perform a logic function, and at least one of the second microelectronic elements can have a greater number of active devices configured to provide memory storage array function than any other function.

In accordance with another aspect of the invention, a microelectronic assembly can include a substrate having oppositely-facing first and second surfaces and an aperture extending between the first and second surfaces, a first microelectronic element having a front surface facing the first surface of the substrate, and a second microelectronic element having a front surface facing the first microelectronic element. The substrate can have terminals. The first microelectronic element can also include a rear surface remote from the front surface and an edge extending between the front and rear surfaces. The first microelectronic element can have a plurality of contacts exposed at the front surface thereof adjacent the edge of the first microelectronic element. The second microelectronic element can have first and second opposed edges. The front surface of the second microelectronic element can extend between the first and second edges. The second microelectronic element can have a plurality of contacts disposed in a central region of the front surface thereof remote from the first and second edges. The front surface of the second microelectronic element can project beyond the edge of the first microelectronic element. The microelectronic assembly can also include first leads electrically connecting the contacts of the first microelectronic element to the terminals, second leads connecting the contacts of the second microelectronic element to the terminals, and third leads electrically connecting the contacts of the first microelectronic element to the terminals. The first leads and third leads can be connected to terminals on opposite sides of the aperture. The first, second, and third leads can have portions aligned with the aperture.

In a particular embodiment, the first microelectronic element can include a chip configured to predominantly perform a logic function. In an exemplary embodiment, the second microelectronic element can have a greater number of active devices configured to provide memory storage array function than any other function. In one embodiment, the first microelectronic element can have a greater number of active devices configured to provide memory storage array function than any other function.

In accordance with yet another aspect of the invention, a microelectronic assembly can include a substrate having oppositely-facing first and second surfaces and an aperture extending between the first and second surfaces, a first microelectronic element having a front surface facing the first surface of the substrate, a second microelectronic element having a front surface facing the first microelectronic element, and a third microelectronic element disposed between first surface of the substrate and the front surface of the second microelectronic element. The substrate can have terminals.

The first microelectronic element can also include a rear surface remote from the front surface and an edge extending between the front and rear surfaces. The first microelectronic element can have a plurality of contacts exposed at the front surface thereof adjacent the edge of the first microelectronic element. The second microelectronic element can have first and second opposed edges. The front surface of the second microelectronic element can extend between the first and second edges. The second microelectronic element can have a plurality of contacts disposed in a central region of the front surface thereof remote from the first and second edges. The front surface of the second microelectronic element can project beyond the edge of the first microelectronic element. The third microelectronic element can have first and second opposed edges, a front surface extending between the first and second edges, and a plurality of contacts disposed on the front surface thereof adjacent the first edge thereof. The front surface of the third microelectronic element can face the first surface of the substrate.

The microelectronic assembly can also include first leads electrically connecting the contacts of the first microelectronic element to the terminals, second leads connecting the contacts of the second microelectronic element to the terminals, third leads electrically connecting the contacts of the third microelectronic element to the terminals, and fourth leads electrically interconnecting the contacts of the first and third microelectronic elements. The contacts of the first and third microelectronic elements can be located on opposite sides of the aperture. The first, second, third, and fourth leads can have portions aligned with the aperture.

In one embodiment, the microelectronic assembly can also include fifth leads electrically interconnecting the contacts of the first and second microelectronic elements. In a particular embodiment, the microelectronic assembly can also include sixth leads electrically interconnecting the contacts of the second and third microelectronic elements. In a particular embodiment, the first microelectronic element can include a chip configured to predominantly perform a logic function. In an exemplary embodiment, the second microelectronic element can have a greater number of active devices configured to provide memory storage array function than any other function. In one embodiment, the first microelectronic element can have a greater number of active devices configured to provide memory storage array function than any other function.

In accordance with still another aspect of the invention, a microelectronic assembly can include a substrate having oppositely-facing first and second surfaces and an aperture extending between the first and second surfaces, a first microelectronic element having a front surface facing the first surface of the substrate, and a second microelectronic element having a front surface facing the first microelectronic element. The substrate can have terminals. The first microelectronic element can also include a rear surface remote from the front surface and an edge extending between the front and rear surfaces. The first microelectronic element can have a plurality of contacts exposed at the front surface thereof adjacent the edge of the first microelectronic element. The second microelectronic element can have first and second opposed edges. The front surface of the second microelectronic element can extend between the first and second edges. The second microelectronic element can have a plurality of contacts disposed in a central region of the front surface thereof remote from the first and second edges. The front surface of the second microelectronic element can project beyond the edge of the first microelectronic element. The microelectronic assembly can also include first leads electrically connecting the contacts of the first microelectronic element to the terminals and second leads connecting the contacts of the second microelectronic element to the terminals. The first and second leads can have portions aligned with the aperture. At least some of the terminals can overlie at least one of the microelectronic elements.

In one embodiment, a microelectronic component can include first and second microelectronic assemblies as described above. The first microelectronic assembly can be electrically connected with and can at least partially overlie the second microelectronic assembly. The microelectronic assemblies can be electrically connected with one another through their terminals. In one embodiment, at least some of the terminals can be electrically connected with conductive elements exposed at the first surface of the substrate by wire bonds. In a particular embodiment, some of the microelectronic elements can include a volatile random access memory (RAM), and some of the microelectronic elements can include nonvolatile flash memory. In an exemplary embodiment, at least one of the first microelectronic elements can be configured predominantly to perform a logic function. At least one of the second microelectronic elements can have a greater number of active devices configured to provide memory storage array function than any other function.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIG. 1C is partial sectional view of a stack microelectronic assembly in accordance with an embodiment of the present invention;

FIG. 4 is a diagrammatic sectional elevation view of a stacked microelectronic assembly in accordance with a further embodiment of the present invention;

FIG. 5 is a sectional view illustrating a portion of the stacked microelectronic assembly shown in FIG. 4;

DETAILED DESCRIPTION

Figure 1A:
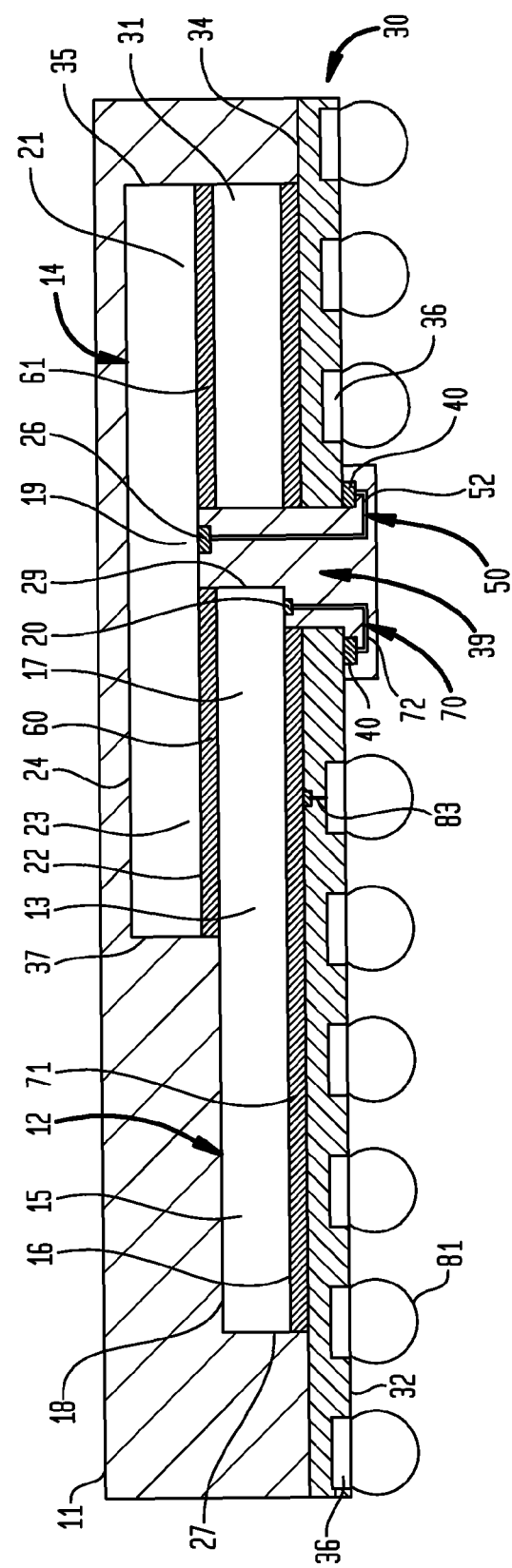
FIG. 1A is a diagrammatic sectional elevation view of a stacked microelectronic assembly in accordance with an embodiment of the present invention.
Figure 2:
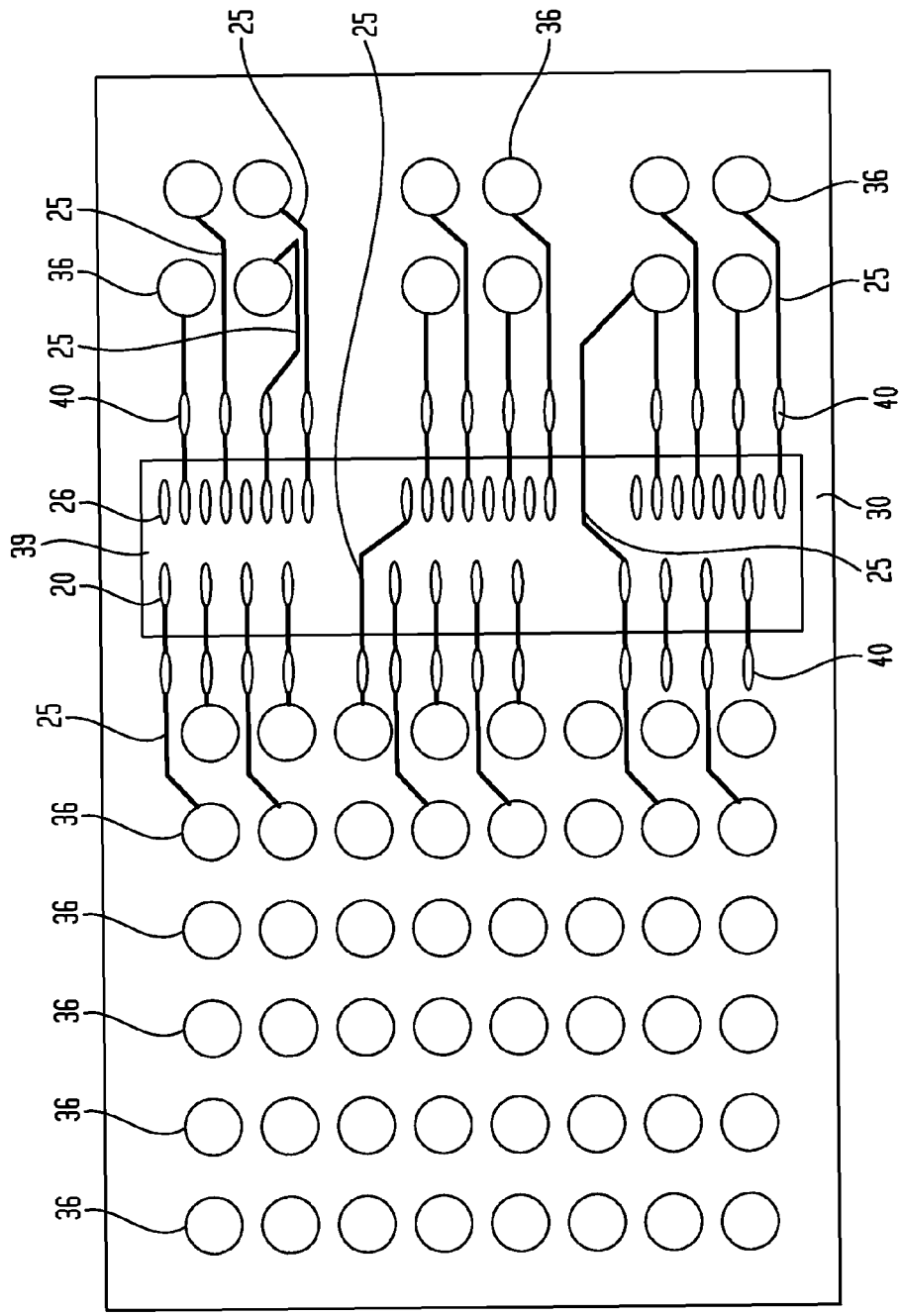
FIG. 2 is a plan view of the microelectronic assembly shown in FIG. 1A.

With reference to FIGS. 1A and 2, a stacked microelectronic assembly 10 according to an embodiment of the present invention includes a first microelectronic element 12 in a face down position facing a substrate 30 and a second microelectronic element 14 in a face down position overlying at least a portion of the first microelectronic element 12. In some embodiments, the first and second microelectronic elements 12 and 14 may be a semiconductor chip, or an element including a semiconductor chip, which has contacts at the front surface 16 thereof. The semiconductor chip may be a thin slab of a semiconductor material, such as silicon or gallium arsenide, and may be provided as individual, prepackaged units. The semiconductor chip may be a thin slab of a semiconductor material, such as silicon or gallium arsenide, and it may be provided as individual, prepackaged units. The semiconductor chip may embody active circuit elements, e.g., transistors, diodes, among others, or passive circuit elements such as resistors, capacitors or inductors, among others, or a combination of active and passive circuit elements. In an "active" semiconductor chip, the active circuit elements in each microelectronic element typically are electrically connected together in one or more "integrated circuits". The first and second microelectronic elements are both electrically connected to a substrate 30, as discussed in detail below. In turn, the substrate 30 can be electrically connected to a circuit panel, such as a printed circuit board, through terminals 36 at a surface thereof. In a particular embodiment, the microelectronic assembly 10 can be a microelectronic "package" having terminals that are configured for electrical connection with corresponding contacts on a face of a circuit panel, such as a printed circuit board, among others.

In particular embodiments, the substrate can be a dielectric element of various types of construction, such as of polymeric material or inorganic material such as ceramic or glass, the substrate having conductive elements thereon such as terminals and conductive elements such as e.g., traces, substrate contacts, or other conductive elements electrically connected with the terminals. In another example, the substrate can consist essentially of a semiconductor material such as silicon, or alternatively include a layer of semiconductor material and one or more dielectric layers thereof. Such substrate may have a coefficient of thermal expansion of less than 7 (seven) parts per million per degree Celsius ("ppm/° C.)". In yet another embodiment, the substrate can be a lead frame having lead fingers, wherein the terminals can be portions of the lead fingers, such as end portions of the lead fingers. In yet another embodiment, the substrate can be a lead frame having leads, wherein the terminals can be portions of the leads, such as end portions of the leads.

The first microelectronic element 12 may include a semiconductor chip configured predominantly to perform a logic function, such as a microprocessor, application-specific integrated circuit ("ASIC"), field programmable gate array ("FPGA") or other logic chip, among others. In a particular embodiment, the microelectronic element 12 can be a controller, or a system on a chip ("SOC") predominantly providing logic function, but which may also include a memory storage array. In other examples, the first microelectronic element 12 can include or be a memory chip such as a flash (NOR or NAND) memory chip, dynamic random access memory ("DRAM") chip or static random access memory ("SRAM") chip, or be configured predominantly to perform some other function. Such memory chip includes a memory storage array and typically has a greater number of active circuit elements, e.g., active devices such as transistors that are configured to provide memory storage array function, than any other function of the chip. The first microelectronic element 12 has a front surface 16, a rear surface 18 remote therefrom, and first and second edges 27, 29, extending between the front and rear surfaces. Electrical contacts 20 are exposed at the front surface 16 of the first microelectronic element 12 adjacent the second edge 27. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a contact, terminal or other conductive element which is exposed at a surface of a structure may project from such surface; may be flush with such surface; or may be recessed relative to such surface and exposed through a hole or depression in the structure. Electrical contacts 20 may be bond pads or other conductive structure such as bumps, posts, etc. The bond pads may include one or more metals such as copper, nickel, gold or aluminum, and may be about 0.5 µm thick. The size of the bond pads can vary with the device type but will typically measure tens to hundreds of microns on a side.

The second microelectronic element 14 has a front surface 22, a rear surface 24 remote therefrom, and first and second edges 35, 37, extending between the front and rear surfaces and contacts 26 exposed at the front surface 22. As seen in FIG. 1A, the first and second microelectronic elements 12 and 14 are stacked relative to each other such that at least a portion of the second microelectronic element 14 overlies at least a portion of the first microelectronic element 12. In a particular embodiment, such as shown in FIG. 1A, the front surface 22 of the second microelectronic element 14 includes first and second end regions 21 and 23 and a central region 19 extending between the first and second end regions 21 and 23. The first end region 21 extends between the central region 19 and first edge 35, and the second end region 23 extends between the central region 19 and the second edge 37. The central region may extend a third of the distance between the first and second edges 35, 37 of the second microelectronic element 14 and the first and second end regions may each extend a third of the distance between the edges 35, 37. Electrical contacts 26 are exposed at the front surface 22 of the second microelectronic element 14. For example, contacts 26 may be arranged in one or two parallel rows adjacent the center of first surface 22. The second microelectronic element 14 may include or be a DRAM chip. Such DRAM chip includes a memory storage array and typically has a greater number of active circuit elements, e.g., active devices such as transistors that are configured to provide memory storage array function than any other function. At least a portion of the central region 19 of the second microelectronic element 14 projects beyond the second edge 29 of the first microelectronic element 12 such that the contacts 26 of the second microelectronic element 14 are exposed beyond the second edge 29 of the first microelectronic element 12. As discussed above, in one embodiment, the substrate 30 may include a dielectric layer having oppositely-facing first and second surfaces 34 and 32. One or more electrically conductive elements or terminals 36 are exposed at the second surface 32 of the substrate 30. In a particular embodiment, some or all of the terminals 36 may be movable with respect to the first and/or second microelectronic element 12 and 14.

The substrate 30 further includes one or more apertures extending between first and second opposed surfaces thereof such as, for example, between the oppositely facing first and second surfaces of a dielectric element 30. In the embodiment depicted in FIG. 1A, the substrate 30 includes an aperture 39 and at least some contacts 26 are aligned with the aperture 39 of the substrate 30. A plurality of leads electrically connects the contacts 26 of the second microelectronic element with the terminals 36 of the microelectronic assembly. The leads have portions aligned with the aperture 39. For example, the leads can include wire bonds 50 bonded to the substrate contacts which in turn connect to terminals 36 through other portions of the leads such as metal traces extending along a semiconductor element or dielectric element 30, or if the substrate includes a lead frame, the leads may include portions of the lead fingers thereof.

The first surface 34 of the dielectric element 30 may be juxtaposed with the front surface 16 of the first microelectronic element 12. As seen in FIG. 1A, the substrate may extend beyond the first edge 27 of the first microelectronic element 12 and the second edge 35 of the second microelectronic element 14. In an example, a substrate which includes a dielectric material may be referred to as a "dielectric element" 30, whether made partly or entirely of any suitable dielectric material. The substrate 30 may be partly or entirely made of any suitable dielectric material. For example, the substrate 30 may comprise a layer of flexible material, such as a layer of polyimide, BT resin or other dielectric material of the commonly used for making tape automated bonding ("TAB") tapes. Alternatively, the substrate 30 may comprise a relatively rigid, board like material such as a thick layer of fiber-reinforced epoxy, such as, Fr-4 or Fr-5 board. Regardless of the material employed, the substrate 30 may composed of a single layer or multiple layers.

Returning to FIG. 1A, a spacing or support element 31 may be positioned between the first end region 21 of the second microelectronic element 14 and a portion of the dielectric element 30. The spacing element 31 may help support the second microelectronic element above the substrate 30. Such a spacing element 31 can be made, for example, from a dielectric material such as silicon dioxide or other material, a semiconductor material such as silicon, or one or more layers of adhesive or other polymeric material. In a particular embodiment, the spacing element can include or be made of metal. If the spacing element includes adhesives, the adhesives can connect the second microelectronic element 14 to the substrate 30. In one embodiment, the spacing element 31 can have substantially the same thickness in a vertical direction that is substantially perpendicular to the first surface 34 of the substrate as the thickness of the first microelectronic element 12 between the front and rear surfaces 16, 18 thereof. If spacing element 31 includes an adhesive, the adhesive can connect the second microelectronic element 14 to the dielectric element 30.

As seen in FIGS. 1A and 2, the substrate 30 may also include electrically conductive elements or substrate contacts 40 and electrically conductive traces 25 exposed on the second surface 32. The electrically conductive traces 25 electrically couple the substrate contacts 40 to the terminals 36. The traces 25 and substrate contacts 40 may be created using the methods illustrated in commonly assigned U.S. Application Publication No. 2005/0181544, the entire disclosure of which is incorporated herein by reference.

Returning to FIG. 1A, a spacing or support element 31, such as an adhesive layer, may be positioned between the first end region 21 of the second microelectronic element 14 and a portion of the substrate 30. If spacing element 31 includes an adhesive, the adhesive can connect the second microelectronic element 14 to the substrate 30. As shown in FIG. 1A, the second end region 23 of the second microelectronic element 14 can be bonded to the second end region 17 of the first microelectronic element 12 with a bond material 60 such as an adhesive, which may be thermally conductive. Likewise, a bond material 61, for example, an adhesive, optionally thermally conductive, may bond the first end region of the second microelectronic element with the spacing element 31. A bond material 71 may be disposed between a significant portion of the front surface 16 of the first microelectronic element and a portion of the first surface 34 of the substrate 30. In a particular embodiment, the bond materials 60, 61, and/or 71 may be partly or entirely made of a die-attach adhesive and, in a particular example, may be comprised of a low elastic modulus material such as silicone elastomer. However, in a particular embodiment the bond materials 60, 61 and/or 71 may be entirely or partly made of a high elastic modulus adhesive or solder if the two microelectronic elements 12 and 14 are conventional semiconductor chips formed of the same material, because the microelectronic elements will tend to expand and contract in unison in response to temperature changes. Irrespective of the materials employed, the spacing element 31 may include a single layer or multiple layers. As discussed in detail below with regard to FIGS. 4-8, the spacing element 31 may be substituted for one or more microelectronic elements.

Referring to FIGS. 1A and 2, the microelectronic assembly may include leads 70 which electrically connect contacts 20 of the first microelectronic element with at least some terminals 36. The leads 70 have portions aligned with the aperture 39 of the substrate 30. In one embodiment, the leads can include bond elements 70 such as wire bonds which extend through the aperture 39 and are bonded to contacts 20, 40 of the microelectronic element and the substrate. Traces (not shown) may extend along the substrate between contacts 40 and terminals 36. In one variation, the bond wires 70 may include wire bonds 72 extending through the aperture 39 and electrically connected to substrate contacts 40. Each of the wire bonds 72 electrically couples a contact 20 to a corresponding substrate contact 40 of the substrate 30. The wire bonds 70 may include a multiple wire bond structure as described in U.S. patent application Ser. No. 12/907,522 filed Oct. 19, 2010 and entitled "Enhanced Stacked Microelectronic Assemblies with Central Contacts and Improved Thermal Characteristics," the entire disclosure of which is incorporated herein by reference. As discussed above and as shown in FIG. 2, traces 25 electrically connect the substrate contacts 40 to the terminals 36. Thus, the leads 50 may include the wire bonds 52, at least some substrate contacts 40, and at least some traces 25. All of these elements contribute to establishing an electrical connection between the contacts 20 of the first microelectronic element 12 and the terminals 36.

Figure 1B:
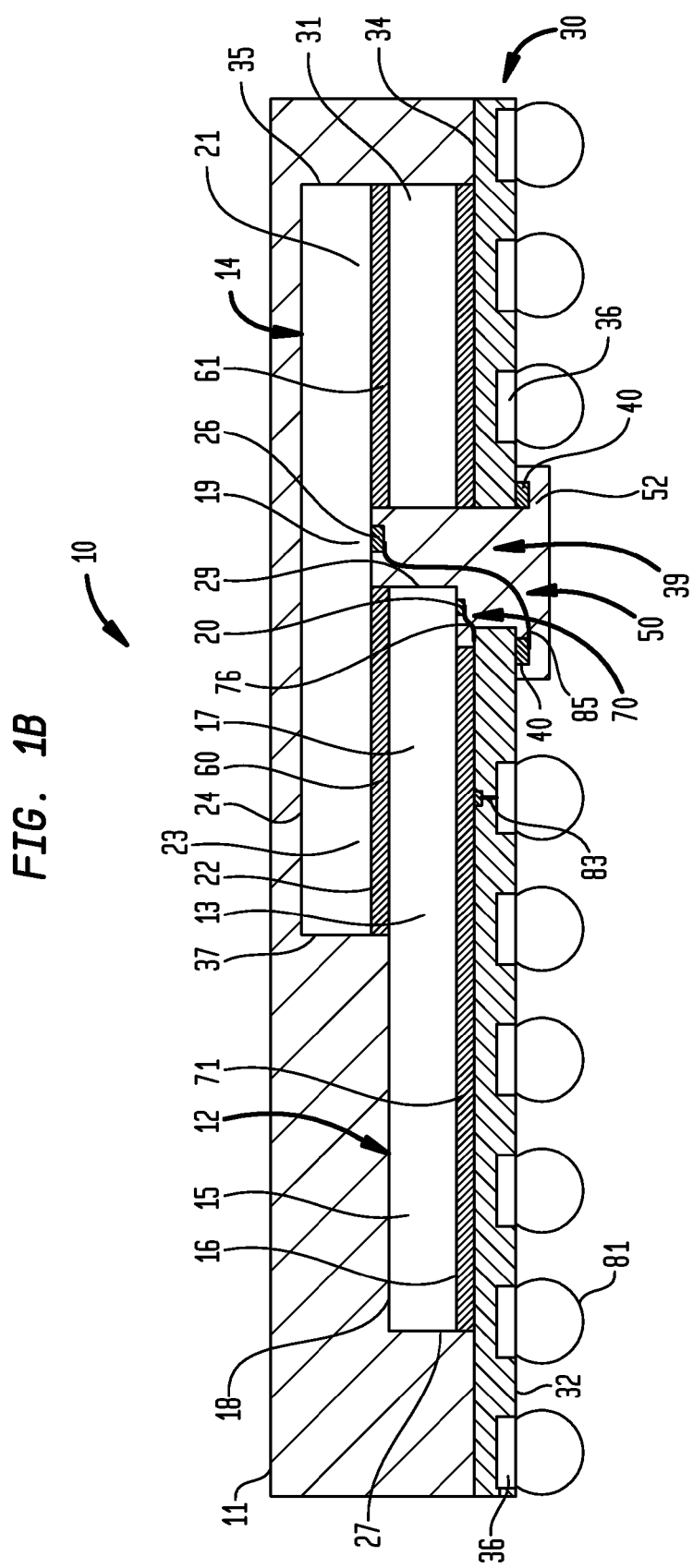
FIG. 1B is diagrammatic sectional elevation view of a stacked microelectronic assembly in accordance with an embodiment of the present invention.

As seen in FIG. 1B, alternatively or additionally, leads such as lead bonds 76 may extend along the first surface 34 of the substrate 30 as shown or along the second surface and into the aperture 39 to connect to contacts 20. The lead bonds 76 may be electrically connected to vias 83 or any other type of electrically conductive element extending from the first surface 34 to one or more terminals 36 at the second surface 32 of the substrate 30. Therefore, the leads 70 may include lead bonds 76 and vias 83. As further shown in FIG. 1B, the microelectronic assembly 10 may include lead bonds 85 electrically interconnecting the contacts 26 of the second microelectronic element 14 with substrate contacts 40 of the second surface 32 of the substrate.

The microelectronic assembly 10 further includes leads 50 electrically connecting contacts 26 of the second microelectronic element 12 to at least some terminals 36 at the second surface 32 of the substrate 30. The leads 50 have portions aligned with the aperture 39 and may include multiple wire bonds 52 electrically connecting the contacts 26 of the second microelectronic elements to substrate contacts 40, at the second surface 32 of the substrate 30. The wire bonds 52 may extend through the aperture 39. Each of the wire bonds 52 electrically couples a contact 26 to a corresponding substrate contact 40 of the substrate 30. Leads 50 may include a multiple wire bond structure as described in U.S. patent application Ser. No. 12/907,522 filed Oct. 19, 2010 and entitled "Enhanced Stacked Microelectronic Assemblies with Central Contacts and Improved Thermal Characteristics," the entire disclosure of which is incorporated herein by reference. As shown in FIG. 2, traces 25 electrically connect the substrate contacts 40 to the terminals 36. Thus, the leads 50 may include the wire bonds 52, at least some substrate contacts 40, and at least some traces 25. All of these elements contribute to establishing an electrical connection between the contacts 26 of the second microelectronic element 14 and the terminals 36. Alternatively or additionally, leads 50 may include lead bonds electrically coupling contacts 26 with some electrically substrate contacts at the first surface 34 of the substrate 30 or at the second surface 32 of the substrate. The lead bonds do not necessarily extend through aperture 39 of the substrate 30 but are at least partially aligned with the aperture.

The microelectronic assembly 10 may further include an overmold or encapsulant 11 covering at least the first microelectronic element 12 and the second microelectronic element 14. As seen in FIG. 1A, the overmold 11 may also cover portions of the substrate 30 extending beyond the first edge 27 of the first microelectronic element 12 and the first edge 35 of the second microelectronic element 14. Consequently, the overmold 11 may contact at least the first edge 27 of the first microelectronic element 12, the first edge 35 of the second microelectronic element 14, and the first surface 34 of the substrate 30. The overmold 11 may be made from any suitable material, including epoxy and the like.

The microelectronic assembly 10 may additionally include a heat spreader or heat sink attached to the rear surfaces of one or more of the first or second microelectronic elements 12 and 14, as described in U.S. patent application Ser. No. 12/907,522 filed Oct. 19, 2010 and entitled "Enhanced Stacked Microelectronic Assemblies with Central Contacts and Improved Thermal Characteristics," the entire disclosure of which is hereby incorporated herein by reference. In some embodiments, the microelectronic assembly 10 includes a heat spreader thermally coupled to the first and/or second microelectronic elements 12 and 14 at one or more of the rear faces 18, 24 thereof and possibly at edge surfaces 27, 35, 37. The heat spreader can occupy some portion of the areas occupied by the overmold 11 shown in FIG. 1A.

In addition, the microelectronic assembly 10 may further include joining units 81 attached to terminals 36 on the second surface 32 of the dielectric element 30. The joining units 81 may be solder balls or other masses of bond and metal, e.g., tin, indium, or a combination thereof, and are adapted to join and electrically couple the microelectronic assembly 10 to a circuit panel, such as a printed circuit board.

As seen in FIG. 1C, the leads 50 of the microelectronic assembly 10 may additionally or alternatively include wire bonds 53 electrically connecting at least some contacts 20 of the first microelectronic element 12 with at least some substrate contacts 40 located on the opposite side of the aperture 39. Thus, the wire bonds 53 may span across the aperture of the substrate 30. In addition, the leads 70 may alternatively or additionally include wire bonds 73 electrically connecting at least some of the contacts 20 of the first microelectronic element 12 with at least some of the contacts 26 of the second microelectronic element 14.

Figure 3A:
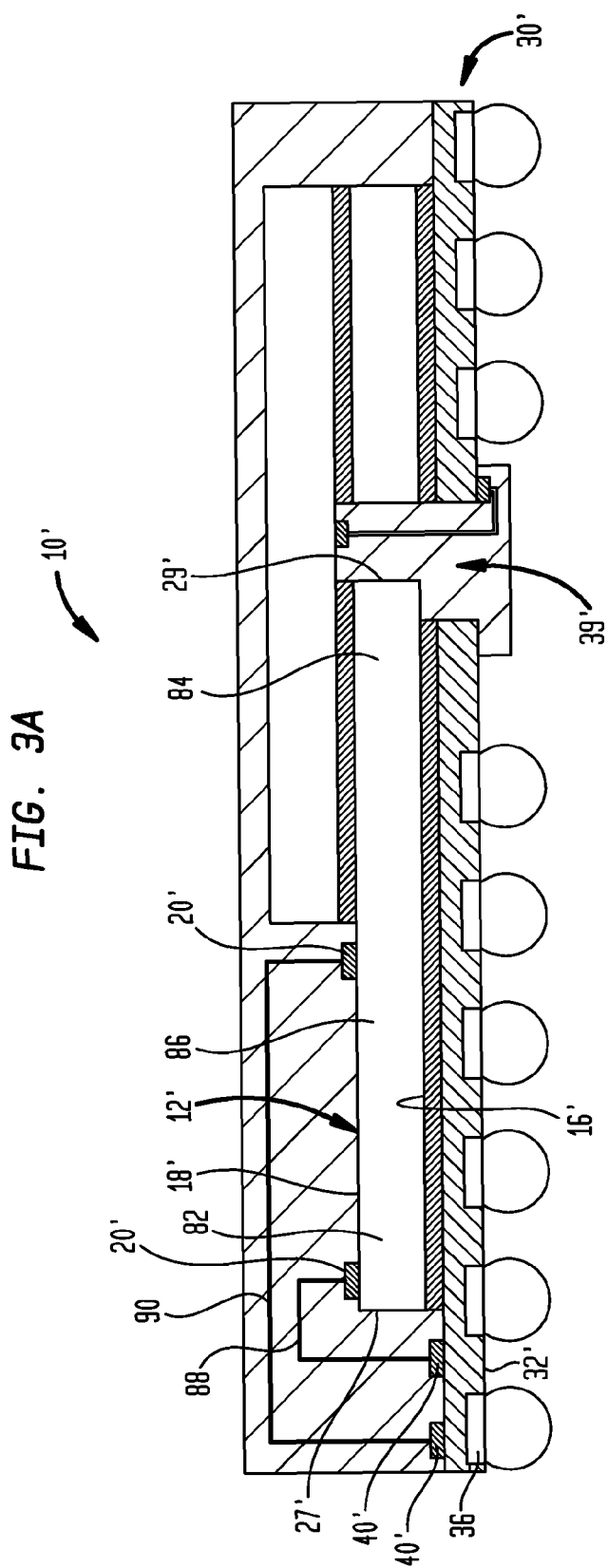
FIG. 3A is a diagrammatic sectional elevation view of a stacked microelectronic assembly in accordance with another embodiment of the present invention.

FIG. 3A depicts a variation 10' of the microelectronic assembly 10 shown in FIG. 1A. In this variation, in lieu (or in addition to) contacts 20 at the surface 16', the first microelectronic element 12' may include contacts 20' at the surface 18 facing away from the substrate 30'. Such surface 18' can be the front face of the first microelectronic element 12'. Surface 18' may have a first end portion 82 adjacent the first edge 27' of the first microelectronic element 12', a second end portion 84 adjacent the second edge 29', and a central portion 86 between the first and second end portions 82 and 84. The contacts 20' may be disposed within the first end portion 82 of the surface 18' adjacent the first edge 27', within the central portion 86 of the surface 18', or within both the first end portion and central portion. In one embodiment, the contacts 20' may be arranged in one or two parallel rows at the central portion 86 of the surface 18'.

Figure 3B:
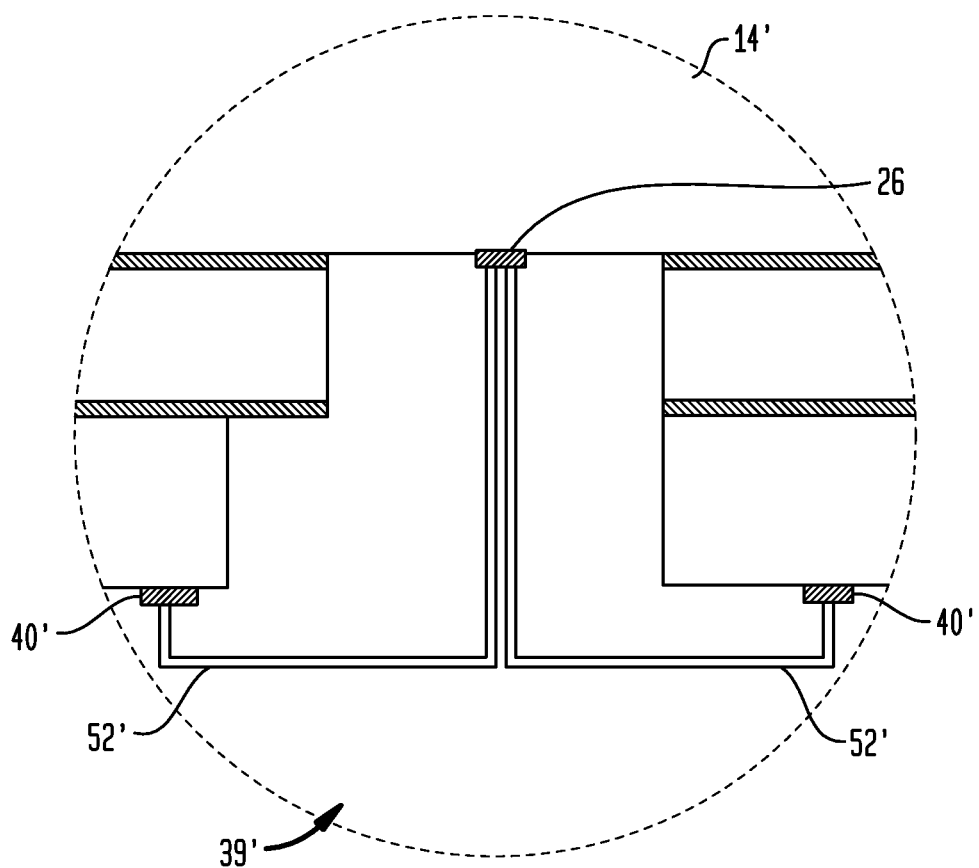
FIG. 3B is a partial sectional view further illustrating the embodiment depicted in FIG. 3A.

The microelectronic assembly 10' can include leads 88 electrically connected with the contacts 20' at the surface 18' and with the terminals 36. In one example, portions of the leads 88 such as wire bonds can extend beyond the first edge 27 of the first microelectronic element 12' to contacts 40' which in turn can be connected to terminals, such as through traces (not shown) or other conductive elements. The leads 88 may include wire bonds 90 extending from the contacts 20', beyond the first edge 27' of the first microelectronic element, and to contacts 40' at the first surface 34' of the substrate 30', and may include other conductive structure of the substrate such as conductive traces between the contacts and the terminals 36. As shown in FIG. 3B, lead portions 52', e.g., wire bonds can connect contacts 26 of microelectronic element 14' to contacts 40' on either or both sides of the aperture 39'.

FIGS. 4 and 5 depict a variation of the microelectronic assembly 10 shown in FIG. 1A. The microelectronic assembly 100 shown in FIG. 1A is similar to the microelectronic assembly 10 shown in FIG. 3A in having a first microelectronic element 101 in a face-up position. In this variation, a third microelectronic element 112 in a flip-chip position is substituted for the spacing element 31. However, in the particular view shown, the first microelectronic element 101 appears at the right and the third microelectronic element 112 to the left of the figure. The third microelectronic element 112 includes a plurality of contacts 120 at a front surface 116 thereof. Contacts 120 of the third microelectronic element 112 are connected with at least some terminals 136 at the second surface 132 of the substrate 130.

The flip-chip interconnection 143 electrically connects electrical contacts 120 on the front surface 116 of the first microelectronic element 112 to at least some contacts 141 on the first surface 134 of the substrate 30 through bumps of metal, e.g., a bond metal such as solder. The microelectronic element is then inverted so the metal bumps provide both the electrical pathway between the contacts (e.g., bond pads) of the microelectronic element and the substrate as well as the mechanical attachment of the microelectronic element to the substrate. There are many variations of the flip-chip process, but one common configuration is to use solder for the bumps of metal and fusion of the solder as the method of fastening it to the bond pads and the substrate. When it melts, the solder may flow to form truncated spheres.

The flip-chip interconnection provides the first microelectronic element 112 with a greater number of (input/output) I/Os in comparison with other microelectronic elements connected to the dielectric element via wire bonds. In addition, the flip-chip interconnection minimizes the wire bond pathway between the second microelectronic element 114 and the substrate 30, thereby reducing the impedance of the wire bonds.

In the embodiment depicted in FIGS. 4 and 5, the flip-chip interconnection 143 may include a plurality of solid metal bumps 145, such as solder balls, disposed between the first microelectronic element 112 and the substrate 130. The metal bumps 145 may be electrically conductive spheres or posts. Each solid metal bump 145 may be disposed between (and in contact with) a contact 120 of the first microelectronic element 112 and a substrate contact 141 of the substrate 130, thereby providing electrical connection between the electrical contact 120 and the electrically conductive element 141. The metal bumps 145 may essentially consist of joining metal or any other suitable material.

An underfill 147 may surround the solid metal bumps 145 to adhere the first microelectronic element 112 to the substrate 130. The underfill 147 may be specifically disposed between the front surface 116 of the first microelectronic element 112 and the first surface 134 of the substrate 130 to couple the first microelectronic element 112 to the substrate 130. For example, the underfill 147 may be wholly or partly made of a polymeric material, such as epoxy resin. In some embodiments, however, the underfill 147 is entirely omitted.

Figure 6:
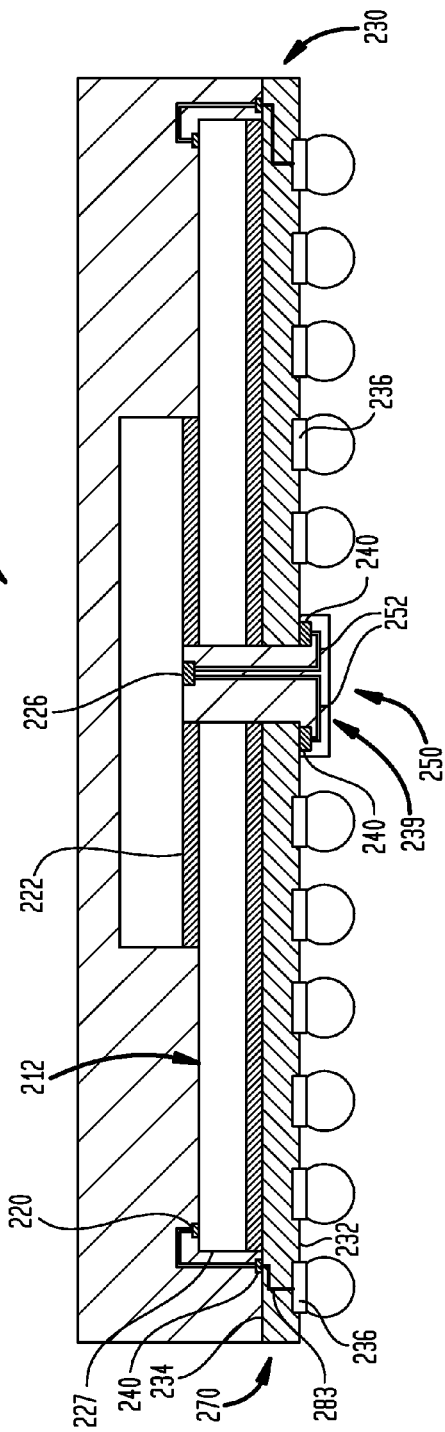
FIG. 6 is a diagrammatic sectional elevation view of a stacked microelectronic assembly in accordance with an embodiment of the present invention.

FIG. 6 illustrates a variation of the microelectronic assembly 100 shown in FIG. 4. The microelectronic assembly 200 is similar to the microelectronic assembly 100 but it does not include a flip-chip interconnection electrically connecting the first microelectronic element to substrate contacts.

Instead, the first microelectronic element 212 is in face-up position and includes one or more parallel rows of contacts 220 adjacent its first edge 227. Leads 270 electrically connect the contacts 220 to terminals 236 on the second surface 236 of the substrate 230.

The leads 270 may include wire bonds 272 extending from the contacts 220, beyond the first edge 227 of the first microelectronic element 212, and to substrate contacts 240 at the second surface 234 of the substrate 230. In addition, the leads 270 may include vias 283 or any other suitable electrically conductive element electrically connecting the substrate contacts 240 with at least some terminals 236. The vias 283 can extend through the substrate 230 from the first surface 234 to the second surface 232 of the substrate 230.

The microelectronic assembly 200 further includes leads 250 electrically connecting the contacts 226 at the front surface 222 of the second microelectronic element 214 to at least some terminals 236. Portions of the leads 250 are aligned with the aperture 239 of the substrate 230. In this variation, the leads 270 include multiple wire bonds 252 extending from the contacts 226 and through the aperture 239. The wire bonds 252 can be electrically connected to substrate contacts 240 located at the second surface 232 of the substrate 230 and on opposite sides of the aperture 239.

Figure 7:
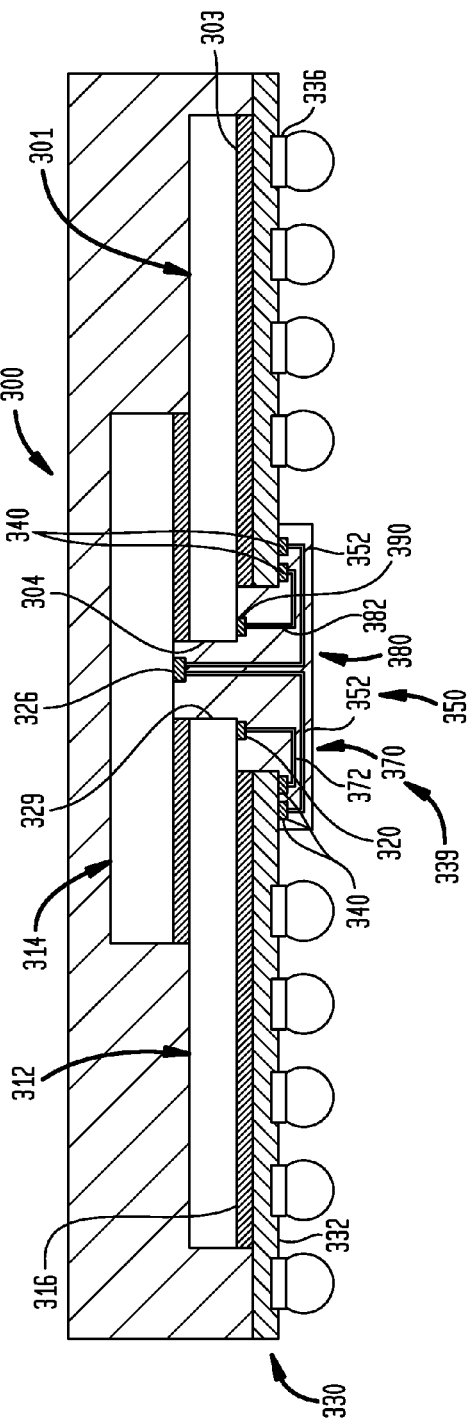
FIG. 7 is a diagrammatic sectional elevation view of a stacked microelectronic assembly in accordance with another embodiment of the present invention.

FIG. 7 depicts a variation of the microelectronic assembly 200 shown in FIG. 6. The microelectronic assembly 300 shown in FIG. 7 is substantially similar to the microelectronic assembly 200 shown in FIG. 1A or 1B, with a third microelectronic element 301 substituted in place of spacing element 31, the third microelectronic element having an electrical interconnection with the substrate which is similar to that of the first microelectronic element 12 (FIG. 1A).

Figure 8:
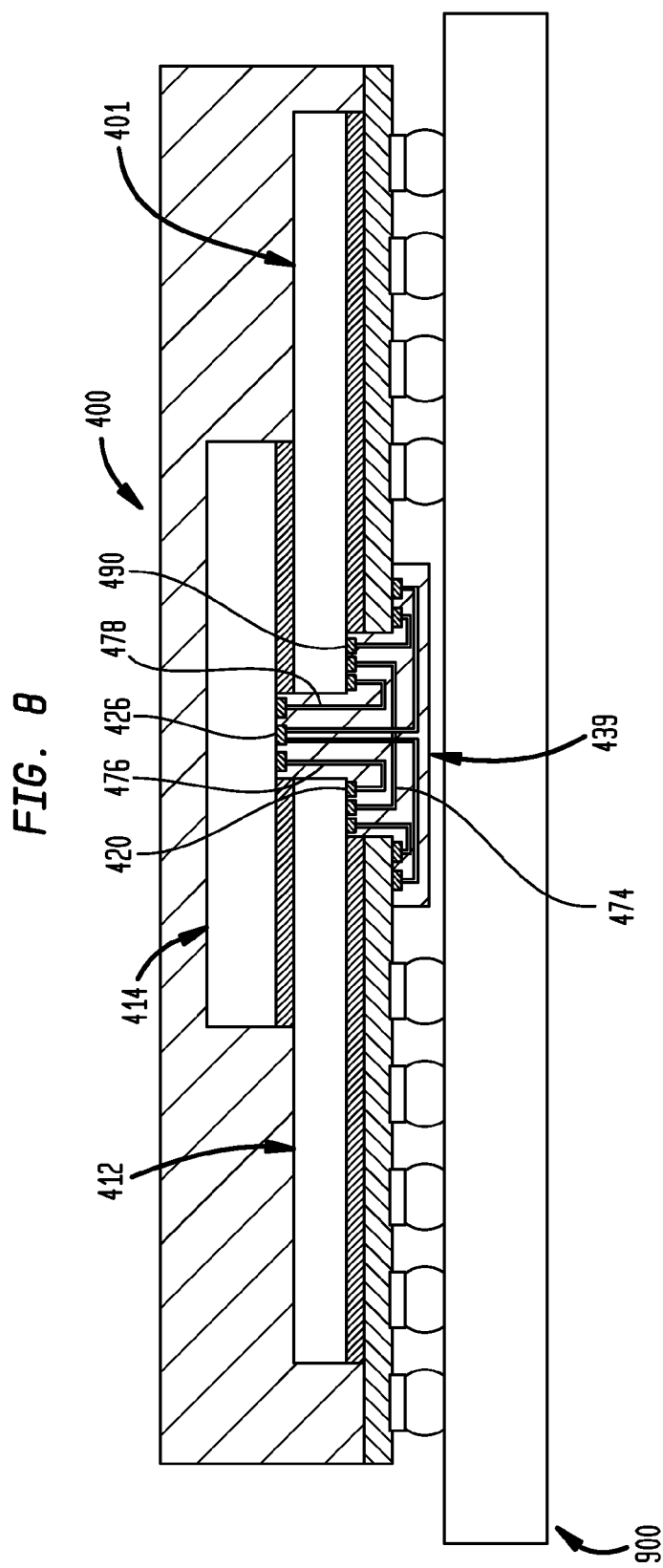
FIG. 8 is a diagrammatic sectional elevation view of a stacked microelectronic assembly in accordance with a further embodiment of the present invention.

FIG. 8 depicts a variation of the microelectronic assembly 300 shown in FIG. 7. In this variation, the microelectronic assembly 400 is shown mounted on an external component such as a circuit panel 900, such as a printed circuit board, and includes additional electrical connection or leads. Although only FIG. 8 illustrates a microelectronic assembly electrically mounted on a circuit panel, such as a printed circuit board, any of the microelectronic assemblies described herein above may be mounted to a circuit panel or other component external to the microelectronic assembly.

The microelectronic assembly 400 may include electrical connection or leads 474 extending across the aperture 439 and electrically connecting a contact 320 of the first microelectronic element 412 with a contact 490 of the third microelectronic element 401. The leads 474 may include wire bonds and/or lead bonds. Another set of electrical connections or leads 476 can be at least partially aligned with the aperture 439 of the substrate 430 and electrically connect at least some contacts 420 of the first microelectronic element 412 with at least some contacts 426 of the second microelectronic element 414. The leads 476 may include wire bonds and/or lead bonds. Yet another set of electrical connections or leads 478 are at least partially aligned with the aperture 430 of the substrate 430 and electrically connect at least some contacts 426 of the second microelectronic element 414 with at least some contacts 490 of the third microelectronic element 401. The leads 478 may include wire bonds and/or lead bonds.

Figure 9A:
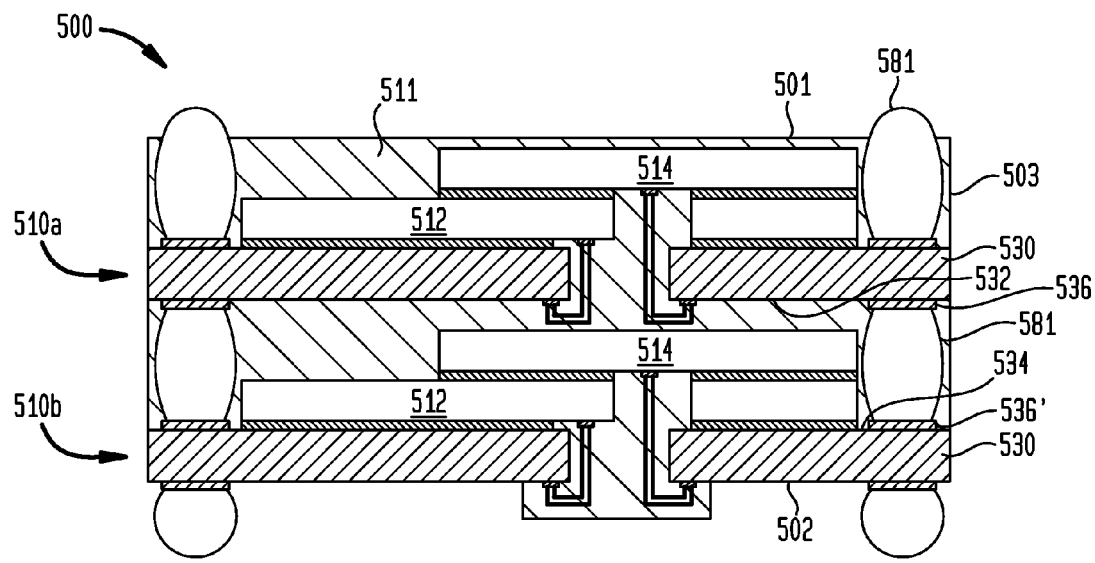
FIG. 9A is a diagrammatic sectional elevation view of a stacked microelectronic assembly in accordance with another embodiment of the present invention.

FIG. 9A shows a stacked variation of the diagrammatic side sectional view shown in FIG. 1A. A microelectronic component 500 can have stacked first and second microelectronic assemblies 510a and 510b (collectively microelectronic assemblies 510). The microelectronic assemblies 510 can each be any of the microelectronic assemblies described above with reference to FIGS. 1A through 8, and the microelectronic assemblies can be the same or different from one another. There can be any number of microelectronic assemblies 510 in the stack, including, for example, two microelectronic assemblies 510a and 510b as shown in FIG. 9A.

Joining units 581 such as solder balls can join and electrically couple the first and second microelectronic assemblies 510a and 510b to one another. Such joining units 581 can be attached to terminals 536 exposed at the second surface 532 of the substrate 530 of the first microelectronic assembly 510a and terminals 536' exposed at the first surface 534 of the substrate 530 of the second microelectronic assembly 510b. The microelectronic component 500 including the stacked microelectronic assemblies 510 can be attached to a circuit panel, such as a printed circuit board, using the joining units 581 exposed at a top surface 501 or a bottom surface 502 of the microelectronic component 500.

Figure 9B:
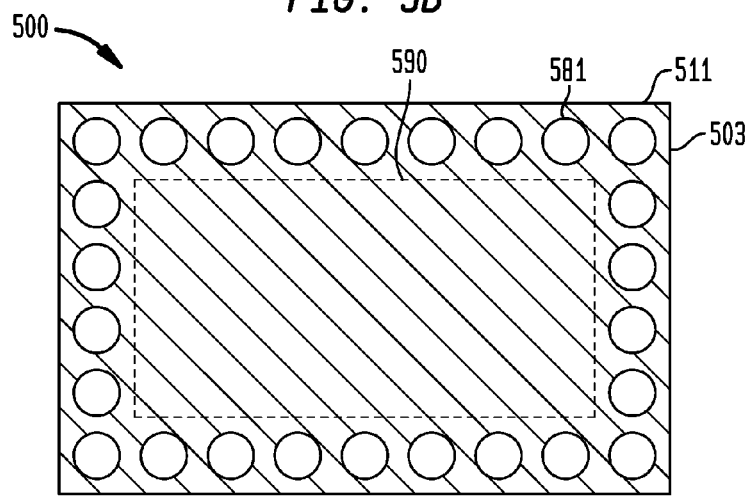
FIG. 9B is a top view of the stacked microelectronic assembly shown in FIG. 9A.

As shown in FIG. 9B, the microelectronic component 500 can include joining units 581 arranged adjacent a periphery 503 of the microelectronic component. The joining units 581 can be located outside of a depopulated central region 590 of the microelectronic component 500. In such an embodiment, the joining units 581 can be arranged so that they do not overlie the first and second microelectronic elements 512 and 514 of the microelectronic assemblies 510. Such an embodiment can allow the plurality of microelectronic assemblies 510 to have a smaller stacked height when joined together than if the microelectronic component 500 included joining units 581 within the central region 590.

As shown in FIG. 9A, the microelectronic component 500 can have a single encapsulant 511 at least partially covering the first and second microelectronic elements 512 and 514 of the microelectronic assemblies 510. In such an embodiment, the microelectronic assemblies 510 can be joined to one another without an encapsulation, and then the single encapsulant 511 can be formed that covers the microelectronic elements within the joined microelectronic component. The encapsulation 511 can cover portions of the microelectronic component 500 that are not configured for electrical connection with one or more components external to the microelectronic component.

Figure 10:
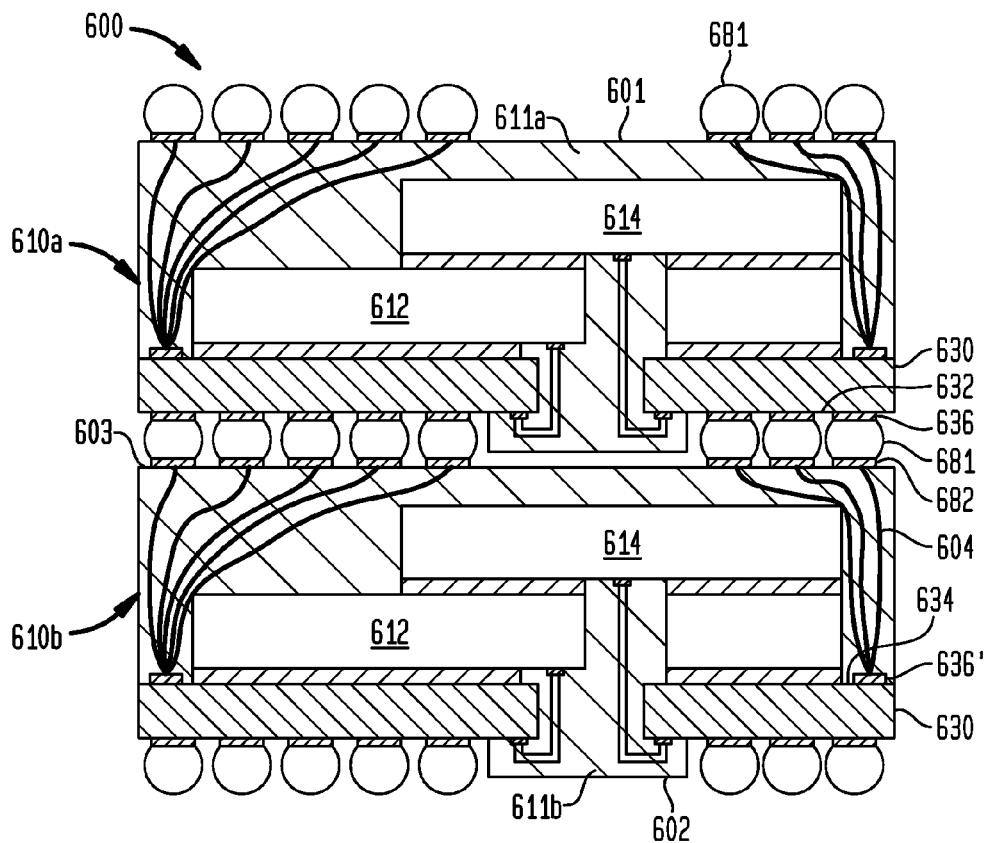
FIG. 10 is a diagrammatic sectional elevation view of a stacked microelectronic assembly in accordance with yet another embodiment of the present invention.

In an alternative embodiment, each of the microelectronic assemblies 510 can be separately formed, each having a respective encapsulant, similar to the embodiment shown in FIG. 10. In such an embodiment having a separately formed encapsulant for each microelectronic assembly 510, such encapsulated microelectronic assemblies can then be stacked and joined to one another, for example, in a configuration such as that shown in FIG. 10, to provide electrical communication between them.

In a particular example, the microelectronic component 500 can be configured to function as nonhomogenous memory, for example, for a smartphone application. In such an example, some of the microelectronic elements 512 and 514 within the microelectronic assemblies 510 can include a memory storage element such as volatile RAM, and some of the microelectronic elements 512 and 514 can include memory storage elements such as nonvolatile flash memory.

FIG. 10 shows a stacked variation of the diagrammatic side sectional view shown in FIG. 9A. A microelectronic component 600 can have stacked first and second microelectronic assemblies 610a and 610b (collectively microelectronic assemblies 610). The microelectronic assemblies 610 can each be any of the microelectronic assemblies described above with reference to FIGS. 1A through 8, and the microelectronic assemblies can be the same or different from one another. There can be any number of microelectronic assemblies 610 in the stack, including, for example, two microelectronic assemblies 610a and 610b as shown in FIG. 9A.

The microelectronic component 600 is the same as the microelectronic component 500 shown in FIGS. 9A and 9B, except that at least some of the joining units 681 overlie the microelectronic elements 612 and 614, and each of the microelectronic assemblies 610a and 610b can be separately formed, each having a respective encapsulant 611a and 610b. In an alternative embodiment, the microelectronic component 600 can have a single encapsulant at least partially covering the first and second microelectronic elements 612 and 614 of the microelectronic assemblies 610, similar to the single encapsulant 511 shown in FIG. 9A.

As shown in FIG. 10, the joining units 681 can join and electrically couple the microelectronic assemblies 610 to one another. Such joining units 681 can be attached to terminals 636 exposed at the second surface 632 of the substrate 630 of the first microelectronic assembly 610a and terminals 682 exposed at a top surface 603 of the encapsulant 611b of the second microelectronic assembly 610b. The terminals 682 can be electrically connected with conductive elements 636' exposed at the first surface 634 of the substrate 630 by wire bonds 604. Some of the terminals 682 exposed at the top surface 603 of the encapsulant 611a or 611b can overlie at least one of the microelectronic elements 612 and 614. In such microelectronic components 600 having microelectronic assemblies 610 with terminals 682 overlying at least one of the microelectronic elements 612 and 614, the terminals 682 and 636 of each microelectronic assembly 610 can be arranged in an area array, which can allow for area array stacking of the microelectronic assemblies 610.

The terminals 682 that are exposed at the top surface 603 of the encapsulant 611a or 611b can extend above the top surface, can be flush with the top surface, or can be recessed below the top surface. Such terminals 682 can have any shape, including for example, a pad-like or ball-like shape. Other examples of shapes and configurations of the terminals 682 and the wire bonds 604 are shown and described in the co-pending and co-owned Korean patent application No. 10-2011-0041843, filed on May 3, 2011, which is hereby incorporated by reference herein.

The microelectronic component 600 including the stacked microelectronic assemblies 610 can be attached to a circuit panel, such as a printed circuit board, using the joining units 681 exposed at a top surface 601 or a bottom surface 602 of the microelectronic component 600.

In a particular example, the microelectronic component 600 can be configured to function as nonhomogenous memory, for example, for a smartphone application. In such an example, some of the microelectronic elements 612 and 614 within the microelectronic assemblies 610 can include a memory storage element such as volatile RAM, and some of the microelectronic elements 612 and 614 can include memory storage elements such as nonvolatile flash memory.

Although the embodiments shown in FIGS. 9A, 9B, and 10 show microelectronic elements electrically connected to contacts of the substrate through wire bonds, in other embodiments, such microelectronic elements can be electrically connected to contacts of the substrate through other connection configurations, including for example, lead bonds and flip-chip mounting of one or more microelectronic elements to contacts of the substrate.

Figure 11:
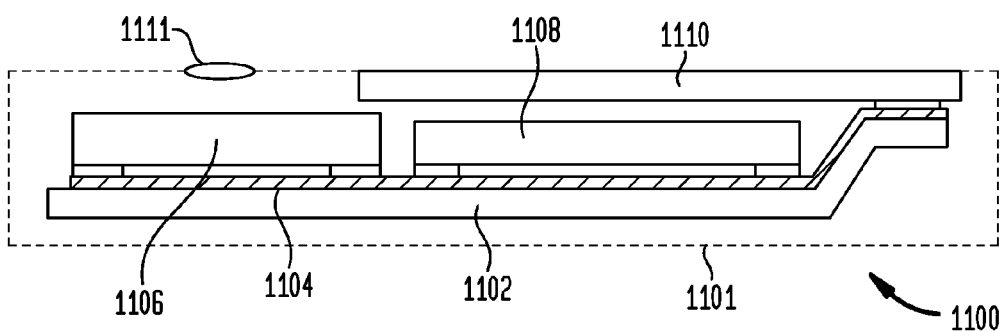
FIG. 11 is a schematic depiction of a system according to one embodiment of the invention.

The microelectronic assemblies described above can be utilized in construction of diverse electronic systems, as shown in FIG. 11. For example, a system 1100 in accordance with a further embodiment of the invention includes a microelectronic assembly 1106 as described above in conjunction with other electronic components 1108 and 1110. In the example depicted, component 1108 is a semiconductor chip whereas component 1110 is a display screen, but any other components can be used. Of course, although only two additional components are depicted in FIG. 11 for clarity of illustration, the system may include any number of such components. The microelectronic assembly 1106 may be any of the assemblies described above. In a further variant, any number of such microelectronic assemblies may be used.

Microelectronic assembly 1106 and components 1108 and 1110 are mounted in a common housing 1101, schematically depicted in broken lines, and are electrically interconnected with one another as necessary to form the desired circuit. In the exemplary system shown, the system includes a circuit panel 1102 such as a flexible printed circuit board, and the circuit panel includes numerous conductors 1104, of which only one is depicted in FIG. 11, interconnecting the components with one another. However, this is merely exemplary; any suitable structure for making electrical connections can be used. The housing 1101 is depicted as a portable housing of the type usable, for example, in a cellular telephone or personal digital assistant, and screen 1110 is exposed at the surface of the housing. Where structure 1106 includes a light sensitive element such as an imaging chip, a lens 1111 or other optical device also may be provided for routing light to the structure. Again, the simplified system shown in FIG. 11 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising:
   a substrate having oppositely-facing first and second surfaces and an aperture extending between the first and second surfaces, the substrate having terminals at the second surface and substrate contacts at the second surface electrically connected with the terminals;
   a first microelectronic element having a front surface facing the first surface of the substrate, a rear surface remote therefrom, and an edge extending between the front and rear surfaces, the first microelectronic element having a plurality of contacts exposed at the front surface thereof adjacent the edge of the first microelectronic element, the contacts of the first microelectronic element disposed adjacent a first side of the aperture;
   a second microelectronic element having first and second opposed edges, a front surface extending between the first and second edges, and a plurality of contacts disposed in a central region of the front surface thereof remote from the first and second edges, the front surface of the second microelectronic element facing the first microelectronic element and projecting beyond the edge of the first microelectronic element, the contacts of the second microelectronic element disposed in a plane perpendicular to the front surface of the second microelectronic element, the plane disposed between the contacts of the first microelectronic element and a second side of the aperture opposite the first side;

first leads extending through the aperture and directly electrically connecting the contacts of the first microelectronic element to a first subset of the substrate contacts at the second surface on a the first side of the aperture;

second leads extending through the aperture and directly electrically connecting the contacts of the second microelectronic element to a second subset of the substrate contacts at the second surface; and third leads extending through the aperture and directly electrically connecting the contacts of the first microelectronic element to a third subset of the substrate contacts at the second surface on the second side of the aperture, the first, second, and third leads having portions aligned with the aperture, the third leads traversing the plane in which the contacts of the second microelectronic element are disposed.

2. The microelectronic assembly as claimed in claim 1, wherein the first microelectronic element includes a chip configured to predominantly perform a logic function.

3. The microelectronic assembly as claimed in claim 1, wherein the second microelectronic element has a greater number of active devices configured to provide memory storage array function than any other function.

4. The microelectronic assembly as claimed in claim 1, wherein the first microelectronic element has a greater number of active devices configured to provide memory storage array function than any other function.

5. The microelectronic assembly as claimed in claim 1, wherein at least one of the first or second leads include wire bonds extending from the contacts of at least one of the first or second microelectronic elements.

6. The microelectronic assembly as claimed in claim 1, wherein the portions of at least one of the first leads and the second leads aligned with the aperture are portions of monolithic conductive elements having second portions extending along the substrate to the terminals.

7. The microelectronic assembly as claimed in claim 1, further comprising a spacing element between the front surface of the second microelectronic element and the first surface of the substrate.

8. The microelectronic assembly as claimed in claim 1, further comprising fourth leads electrically interconnecting the contacts of the first and second microelectronic elements.

9. The microelectronic assembly as claimed in claim 1, wherein the terminals are first terminals exposed at the second surface of the substrate, the microelectronic assembly further comprising second terminals exposed at a surface of the microelectronic assembly opposite from the second surface of the substrate, at least some of the second terminals overlying at least one of the microelectronic elements.

10. The microelectronic assembly as claimed in claim 9, wherein at least some of the second terminals are electrically connected with conductive elements exposed at the first surface of the substrate by wire bonds.

11. The microelectronic assembly as claimed in claim 10, further comprising an encapsulant at least partially covering the first and second microelectronic elements and at least portions of the wire bonds, wherein the surface of the microelectronic assembly at which the second terminals are exposed is a surface of the encapsulant.

12. The microelectronic assembly as claimed in claim 11, wherein the wire bonds have bases attached to the conductive elements and unencapsulated end surfaces remote from the conductive elements, and edge surfaces extending between the bases and the unencapsulated end surfaces, the unencapsulated end surfaces being uncovered by the encapsulant, wherein the second terminals are electrically connected with the unencapsulated end surfaces.

13. A microelectronic component including first and second microelectronic assemblies, each microelectronic assembly as claimed in claim 1, the first microelectronic assembly electrically connected with and at least partially overlying the second microelectronic assembly.

14. The microelectronic component as claimed in claim 13, wherein the microelectronic assemblies are electrically connected with one another through joining units arranged adjacent a periphery of the microelectronic component, the joining units extending directly between second terminals at the first surface of the substrate of the second microelectronic assembly and the terminals at the second surface of the substrate of the first microelectronic assembly, the joining units consisting of solder balls.

15. The microelectronic component as claimed in claim 14, wherein the joining units are located outside of a depopulated central region of the microelectronic component.

16. The microelectronic component as claimed in claim 13, wherein some of the microelectronic elements include a volatile random access memory (RAM), and some of the microelectronic elements include nonvolatile flash memory.

17. The microelectronic component as claimed in claim 13, wherein at least one of the first microelectronic elements is configured predominantly to perform a logic function, and at least one of the second microelectronic elements has a greater number of active devices configured to provide memory storage array function than any other function.

18. A system comprising the microelectronic assembly according to claim 1 and one or more other electronic components electrically connected to the microelectronic assembly.

19. The system as claimed in claim 18, wherein the terminals are electrically connected to a circuit panel.

20. The system as claimed in claim 18, further comprising a housing, the microelectronic assembly and the other electronic components being mounted to the housing.

* * * * *